(12) United States Patent
Lee et al.

(10) Patent No.: US 12,177,985 B2
(45) Date of Patent: Dec. 24, 2024

(54) METHOD AND APPARATUS FOR MANUFACTURING DISPLAY DEVICE

(71) Applicant: Samsung Display Co., Ltd., Yongin-si (KR)

(72) Inventors: Joonik Lee, Yongin-si (KR); Cheuljin Park, Yongin-si (KR); Kisang Yoo, Yongin-si (KR); Hyunkyung Yun, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 251 days.

(21) Appl. No.: 17/847,128

(22) Filed: Jun. 22, 2022

(65) Prior Publication Data

US 2023/0110932 A1    Apr. 13, 2023

(30) Foreign Application Priority Data

Oct. 8, 2021 (KR) .................. 10-2021-0134446

(51) Int. Cl.
| | |
|---|---|
| *H05K 13/08* | (2006.01) |
| *H05K 13/00* | (2006.01) |
| *G06F 1/16* | (2006.01) |
| *H05K 5/00* | (2006.01) |
| *H05K 5/03* | (2006.01) |

(52) U.S. Cl.
CPC ..... *H05K 13/0815* (2018.08); *H05K 13/0015* (2013.01); *H05K 13/0812* (2018.08); *G06F 1/1626* (2013.01); *H05K 5/0018* (2022.08); *H05K 5/03* (2013.01)

(58) Field of Classification Search
None
See application file for complete search history.

(56) References Cited

U.S. PATENT DOCUMENTS

| | | | |
|---|---|---|---|
| 2010/0002051 A1* | 1/2010 | Yoshimura | ................. B41J 2/15 347/40 |
| 2014/0353598 A1* | 12/2014 | Jeong | .................... H01L 23/544 257/40 |
| 2017/0090517 A1* | 3/2017 | Park | ......................... H05K 3/12 |

(Continued)

FOREIGN PATENT DOCUMENTS

| | | |
|---|---|---|
| KR | 10-2230000 | 3/2021 |
| KR | 10-2021-0052655 | 5/2021 |
| KR | 10-2021-0070452 | 6/2021 |

*Primary Examiner* — Rodney E Fuller
(74) *Attorney, Agent, or Firm* — CANTOR COLBURN LLP

(57) ABSTRACT

An apparatus for manufacturing a display device including: a photographing member configured to photograph a first alignment mark, a second alignment mark, a third alignment mark, and a fourth alignment mark, which are provided in a display panel; and a control member configured to set an imaginary reference point, taking into account the first alignment mark, the second alignment mark, the third alignment mark, and the fourth alignment mark, which are photographed by the photographing member. The control member sets a first position which is included in the imaginary reference point and at which a first imaginary straight line connecting the first alignment mark to the third alignment mark and a second imaginary straight line connecting the second alignment mark to the fourth alignment mark cross each other.

18 Claims, 39 Drawing Sheets

(56) References Cited

U.S. PATENT DOCUMENTS

| | | |
|---|---|---|
| 2018/0182713 A1 | 6/2018 | Shiba |
| 2020/0170126 A1* | 5/2020 | Ahn ................... H10K 59/121 |
| 2021/0124391 A1 | 4/2021 | Kim et al. |
| 2021/0176879 A1 | 6/2021 | Song et al. |

* cited by examiner

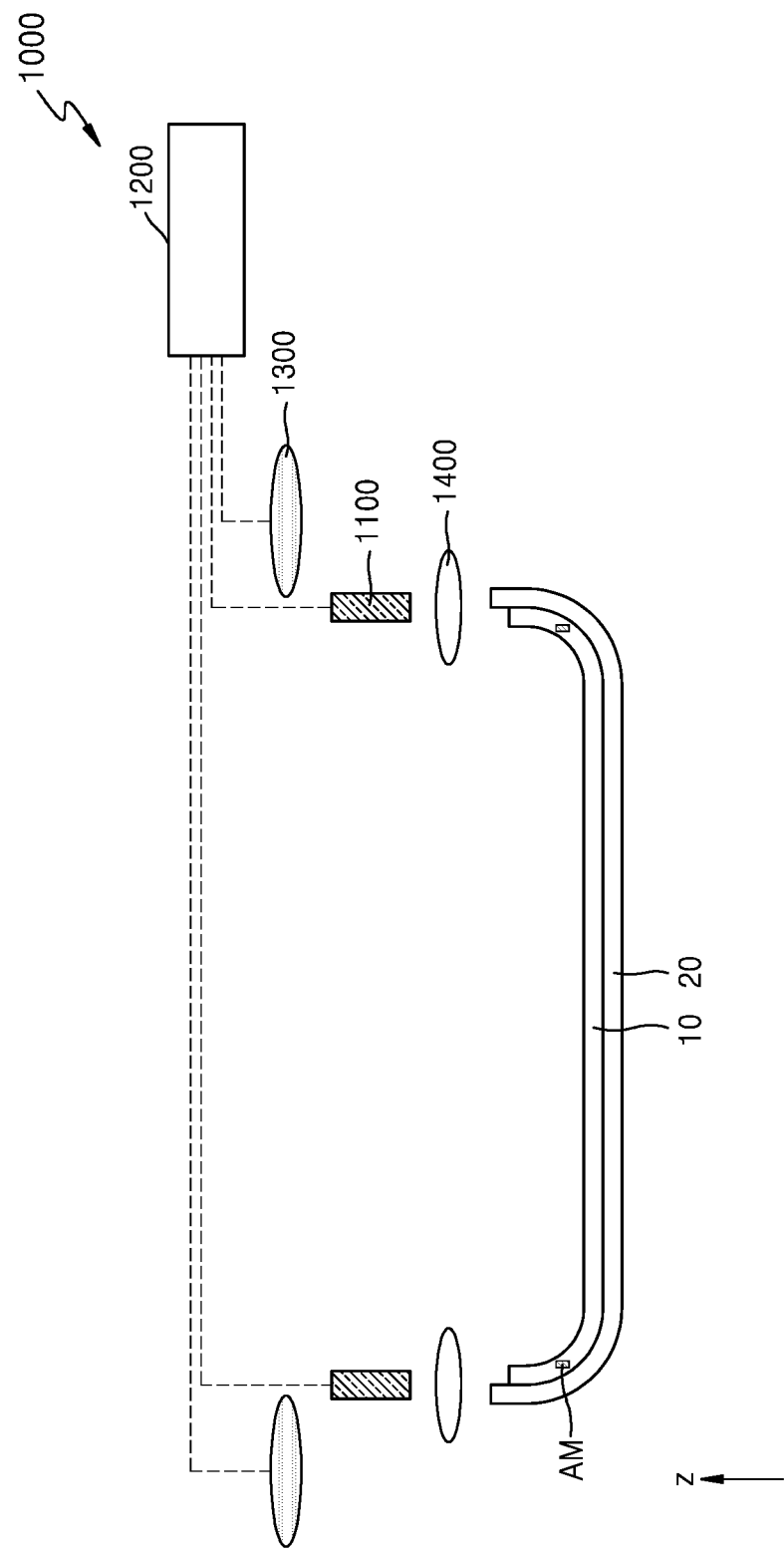

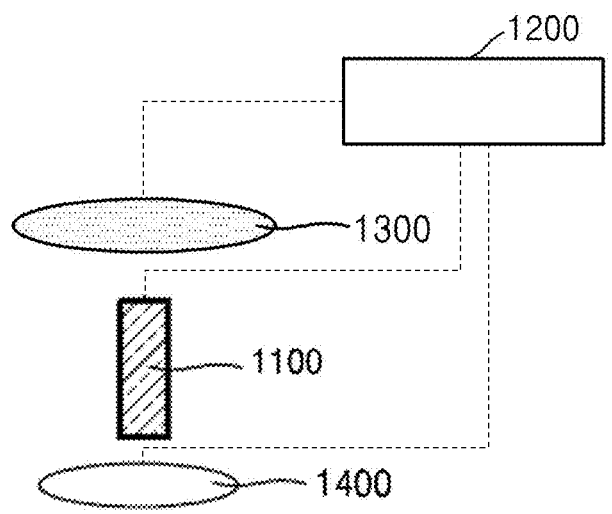
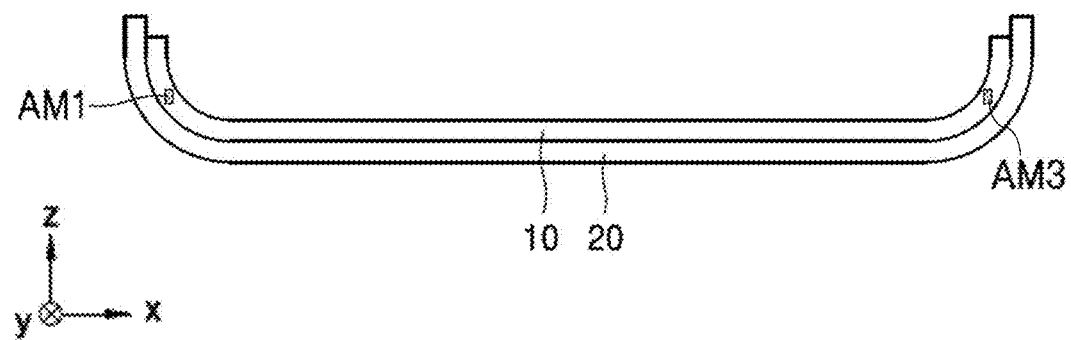
FIG. 15A

METHOD AND APPARATUS FOR MANUFACTURING DISPLAY DEVICE

CROSS-REFERENCE TO RELATED APPLICATION

This application claims priority from and the benefit of Korean Patent Application No. 10-2021-0134446, filed on Oct. 8, 2021, which is hereby incorporated by reference for all purposes as if fully set forth herein.

BACKGROUND

Field

Embodiments of the invention relate generally to a method and an apparatus for manufacturing a display device.

Discussion of the Background

Mobile electronic devices are widely used. As mobile electronic devices, not only small electronic devices, such as mobile phones but also tablet personal computers (PCs), have been widely used in recent years.

Such mobile electronic devices include display devices to provide various functions, for example, to provide visual information, such as images or videos, to users. Recently, as other parts for driving display devices have been miniaturized, the proportion occupied by display devices in electronic devices has gradually been increasing. A structure that is bendable to have a certain angle from a flat state is also under development.

In a process of manufacturing such a display device, alignment marks may be provided in a display panel included in the display device. The display panel and other members may be aligned by using the alignment marks.

The above information disclosed in this Background section is only for understanding of the background of the inventive concepts, and, therefore, it may contain information that does not constitute prior art.

SUMMARY

When a display panel has a bent shape, a position of an alignment mark located in a bent area may be changed according to the curvature of the bent area. Embodiments of the invention provide a method and an apparatus for manufacturing a display device, capable of reducing a process error in a process of manufacturing the display device by setting an imaginary reference point from a plurality of alignment marks.

Additional features of the inventive concepts will be set forth in the description which follows, and in part will be apparent from the description, or may be learned by practice of the inventive concepts.

An embodiment of the invention provides an apparatus for manufacturing a display device including a photographing member configured to photograph a first alignment mark, a second alignment mark, a third alignment mark, and a fourth alignment mark, which are provided in a display panel, and a control member configured to set an imaginary reference point, taking into account the first alignment mark, the second alignment mark, the third alignment mark, and the fourth alignment mark, which are photographed by the photographing member. The control member is further configured to set a first position which is included in the imaginary reference point and at which a first imaginary straight line connecting the first alignment mark to the third alignment mark and a second imaginary straight line connecting the second alignment mark to the fourth alignment mark cross each other.

The display panel may include a central area, a first outer peripheral area outside the central area and including the first alignment mark, a second outer peripheral area outside the central area and including the second alignment mark, a third outer peripheral area spaced apart from the first outer peripheral area in a first direction with the central area therebetween and including the third alignment mark, and a fourth outer peripheral area spaced apart from the second outer peripheral area in a second direction crossing the first direction with the central area therebetween and including the fourth alignment mark, the first outer peripheral area, the second outer peripheral area, the third outer peripheral area, and the fourth outer peripheral area may be bent. The photographing member may be further configured to photograph the first alignment mark, the second alignment mark, the third alignment mark, and the fourth alignment mark in a plan view.

The first outer peripheral area may further include a fifth alignment mark spaced apart from the first alignment mark in the second direction, the second outer peripheral area may further include a sixth alignment mark spaced apart from the second alignment mark in the first direction, the third outer peripheral area may further include a seventh alignment mark spaced apart from the third alignment mark in the second direction, the fourth outer peripheral area may further include an eighth alignment mark spaced apart from the fourth alignment mark in the first direction. The photographing member may be further configured to photograph the fifth alignment mark, the sixth alignment mark, the seventh alignment mark, and the eighth alignment mark in a plan view.

The control member may be further configured to set a second position which is included in the imaginary reference point and at which the second imaginary straight line and a third imaginary straight line connecting the fifth alignment mark to the seventh alignment mark cross each other, set a third position which is included in the imaginary reference point and at which the third imaginary straight line and a fourth imaginary straight line connecting the sixth alignment mark to the eighth alignment mark cross each other, and set a fourth position which is included the imaginary reference point and at which the first imaginary straight line and the fourth imaginary straight line cross each other.

The photographing member may be further configured to photograph a first edge of the first outer peripheral area and a second edge of the second outer peripheral area, and the control member may be further configured to set a first outer position which is included in the imaginary reference point and at which a first imaginary outer straight line overlapping the first edge and extending in the second direction and a second imaginary outer straight line overlapping the second edge and extending in the first direction cross each other.

In a cover window bonded to the display panel, the photographing member may be further configured to photograph a first window edge of the cover window at least partially extending in a first direction, and a second window edge of the cover window at least partially extending in a second direction crossing the first direction. The control member may be further configured to set a first window position which is included in the imaginary reference point and at which a first imaginary window straight line overlapping the first window edge and extending in the first direction and a second imaginary window straight line overlapping the second window edge and extending in the second direction cross each other.

The apparatus may further include at least one of a backlight member and an optical member between the photographing member and the display panel.

The control member may be further configured to take into account the imaginary reference point when a cover panel is arranged on the display panel.

The display panel may include a bending area and a pad area outside the bending area, and the control member may be further configured to take into account the imaginary reference point when bending the bending area.

Another embodiment of the invention provides an apparatus for manufacturing a display device including a photographing member configured to photograph a first edge of a first outer peripheral area and a second edge of a second outer peripheral area in a display panel including a central area, the first outer peripheral area adjacent in a first direction and arranged outside the central area, and the second outer peripheral area adjacent in a second direction crossing the first direction and arranged outside the central area, and a control member configured to set an imaginary reference point, taking into account the first edge and the second edge. The control member is further configured to set a first outer position which is included in the imaginary reference point and at which a first imaginary outer straight line overlapping the first edge and extending in the second direction and a second imaginary outer straight line overlapping the second edge and extending in the first direction cross each other.

A method of manufacturing a display device includes photographing a first alignment mark, a second alignment mark, a third alignment mark, and a fourth alignment mark, which are provided in a display panel, and setting a first position which is included in an imaginary reference point and at which a first imaginary straight line connecting the first alignment mark to the third alignment mark and a second imaginary straight line connecting the second alignment mark to the fourth alignment mark cross each other.

The display panel may include a central area, a first outer peripheral area outside the central area and including the first alignment mark, a second outer peripheral area outside the central area and including the second alignment mark, a third outer peripheral area spaced apart from the first outer peripheral area in a first direction with the central area therebetween and including the third alignment mark, and a fourth outer peripheral area spaced apart from the second outer peripheral area in a second direction crossing the first direction with the central area therebetween and including the fourth alignment mark, and the first outer peripheral area, the second outer peripheral area, the third outer peripheral area, and the fourth outer peripheral area may be bent.

The first outer peripheral area may further include a fifth alignment mark spaced apart from the first alignment mark in the second direction, the second outer peripheral area may further include a sixth alignment mark spaced apart from the second alignment mark in the first direction, the third outer peripheral area may further include a seventh alignment mark spaced apart from the third alignment mark in the second direction, the fourth outer peripheral area may further include an eighth alignment mark spaced apart from the fourth alignment mark in the first direction. The method may further include setting a second position which is included in the imaginary reference point and at which the second imaginary straight line and a third imaginary straight line connecting the fifth alignment mark to the seventh alignment mark cross each other, setting a third position which is included in the imaginary reference point and at which the third imaginary straight line and a fourth imaginary straight line connecting the sixth alignment mark to the eighth alignment mark cross each other, and setting a fourth position which is included in the imaginary reference point and at which the first imaginary straight line and the fourth imaginary straight line cross each other.

The display panel may further include a corner area that is arranged at a corner and bent, and a plurality of pixels may be in the central area and the corner area.

The method may further include photographing a first edge of the first outer peripheral area and a second edge of the second outer peripheral area, and setting a first outer position which is included in the imaginary reference point and at which a first imaginary outer straight line overlapping the first edge and extending in the second direction and a second imaginary outer straight line overlapping the second edge and extending in the first direction cross each other.

The method may further include, in a cover window bonded to the display panel, photographing a first window edge of the cover window at least partially extending in a first direction, and a second window edge of the cover window at least partially extending in a second direction crossing the first direction, and setting a first window position which is included in the imaginary reference point and at which a first imaginary window straight line overlapping the first window edge and extending in the first direction and a second imaginary window straight line overlapping the second window edge and extending in the second direction cross each other.

A photographing member may be configured to photograph the first alignment mark, the second alignment mark, the third alignment mark, and the fourth alignment mark in a plan view.

The method may further include arranging a cover panel on the display panel, taking into account the imaginary reference point.

The display panel may include a bending area and a pad area outside the bending area, and the method may further include bending the bending area, taking into account the imaginary reference point.

Another embodiment of the invention provides a method of manufacturing a display device including photographing a first edge of a first outer peripheral area and a second edge of a second outer peripheral area in a display panel including a central area, the first outer peripheral area adjacent in a first direction and arranged outside the central area, and the second outer peripheral area adjacent in a second direction crossing the first direction and arranged outside the central area, and setting a first outer position which is included in an imaginary reference point and at which a first imaginary outer straight line overlapping the first edge and extending in the second direction and a second imaginary outer straight line overlapping the second edge and extending in the first direction cross each other.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 8 is a diagram schematically illustrating an apparatus for manufacturing a display device, according to an embodiment.

FIGS. 15A and 15B are diagrams schematically illustrating an apparatus for manufacturing a display device, according to an embodiment.

DETAILED DESCRIPTION

Figure 1:
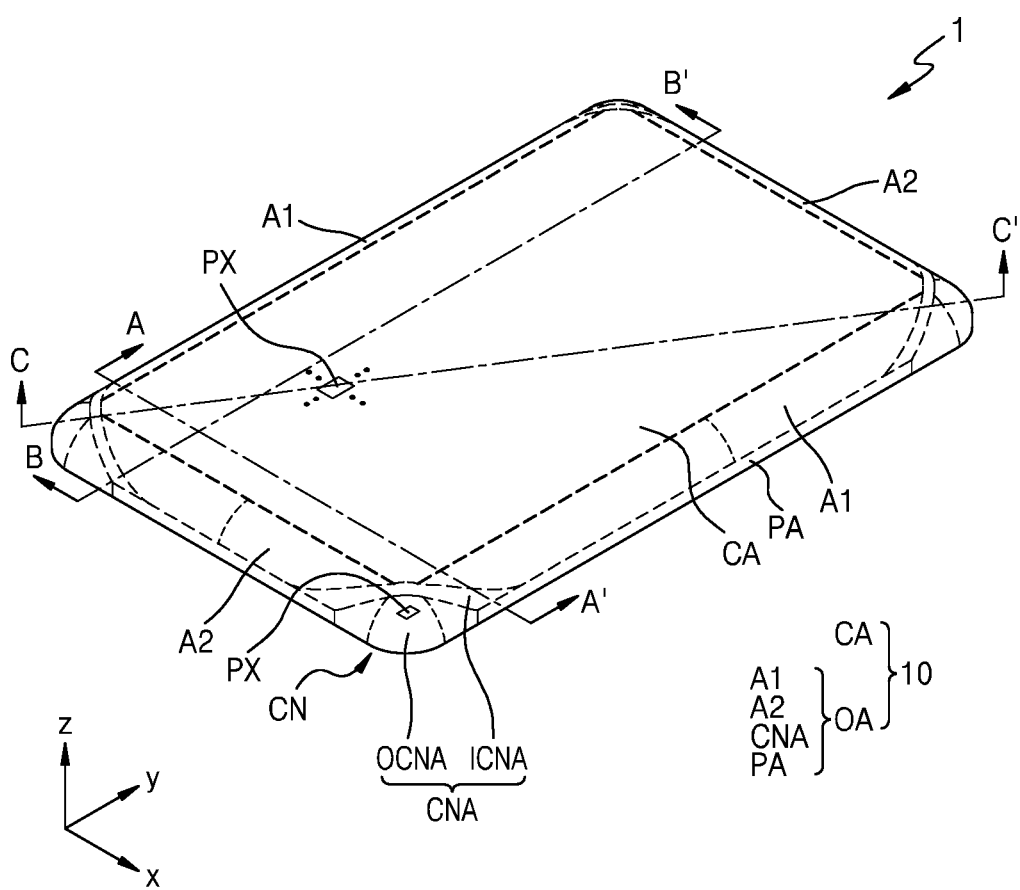
FIG. 1 is a perspective view schematically illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
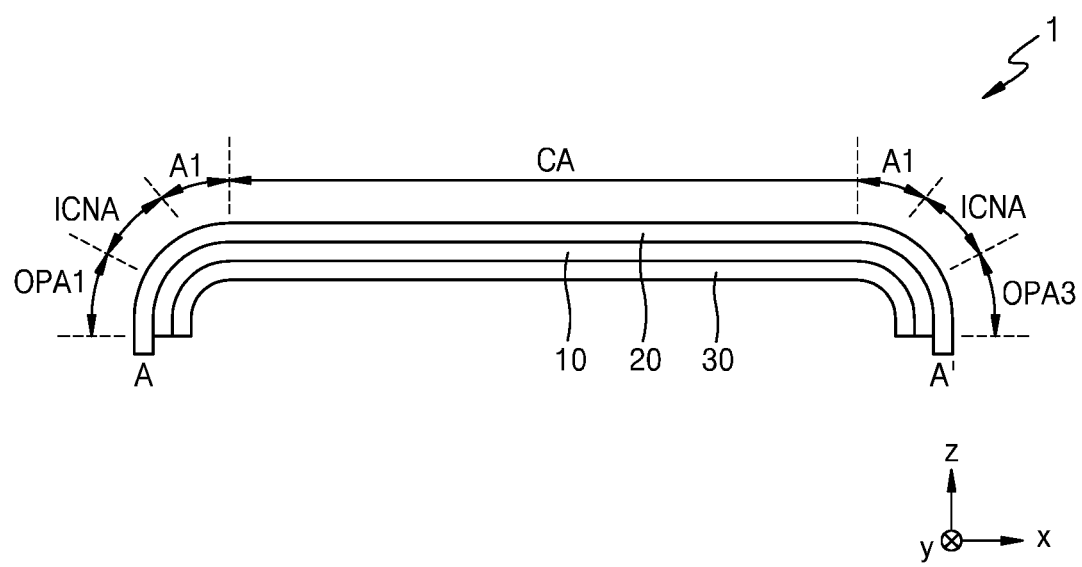
FIG. 2A is a cross-sectional view of the display device taken along line A-A' of FIG. 1.
Figure 2B:
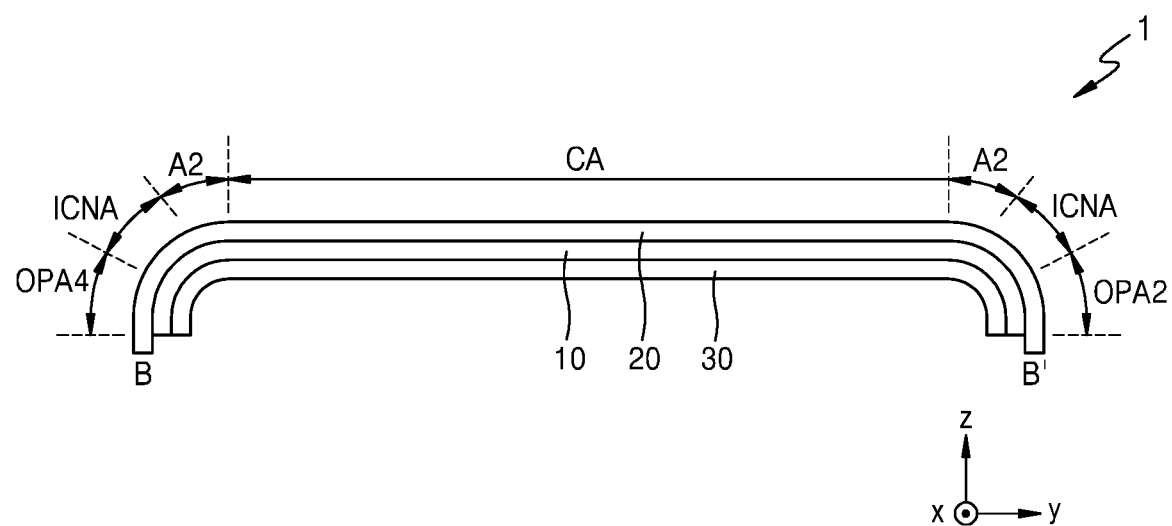
FIG. 2B is a cross-sectional view of the display device taken along line B-B' of FIG. 1.
Figure 2C:
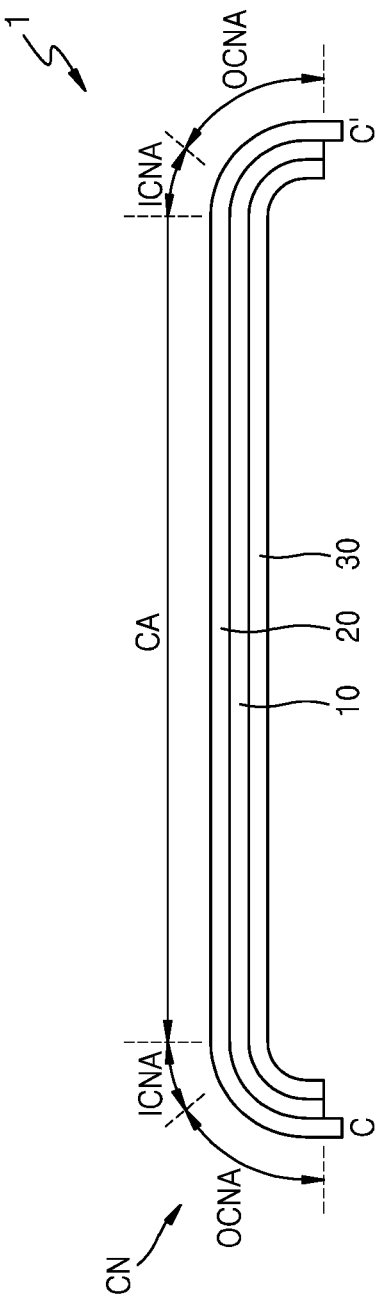
FIG. 2C is a cross-sectional view of the display device taken along line C-C' of FIG. 1.

FIG. 1 is a perspective view schematically illustrating a display device 1 according to an embodiment. FIG. 2A is a cross-sectional view of the display device 1 taken along line A-A' of FIG. 1. FIG. 2B is a cross-sectional view of the display device 1 taken along line B-B' of FIG. 1. FIG. 2C is a cross-sectional view of the display device 1 taken along line C-C' of FIG. 1.

Referring to FIGS. 1 and 2A to 2C, the display device 1 may display an image. The display device 1 may have an edge in a first direction and an edge in a second direction. The first direction and the second direction may cross each other. For example, the first direction and the second direction may provide an acute angle. As another example, the first direction and the second direction may provide an obtuse angle or may be orthogonal to each other. Hereinafter, a case in which the first direction and the second direction are orthogonal to each other will be described in detail. For example, the first direction may be the x direction or the −x direction, and the second direction may be the y direction or the −y direction.

The display device 1 may include a display panel 10, a cover window 20, and a cover panel 30. The display panel 10 may display an image by using a pixel PX. The display panel 10 may include a central area CA and an outer area OA. The central area CA may be a flat area. In an embodiment, the display device 1 may provide most of the image in the central area CA. A plurality of pixels PX may be in the central area CA.

The outer area OA may be outside the central area CA. The outer area OA may at least partially surround the central area CA. In an embodiment, the outer area OA may completely surround the central area CA. The outer area OA may be bent. For example, the outer area OA may be bent with respect to the first direction (e.g., the x direction or the −x direction), or may be bent with respect to the second direction (e.g., the y direction or the −y direction). Alternatively, the outer area OA may be bent with respect to a direction crossing the first direction (e.g., the x direction or the −x direction) and the second direction (e.g., the y direction or the −y direction). The outer area OA may include a first adjacent area A1, a second adjacent area A2, a corner area CNA, and a peripheral area PA.

The first adjacent area A1 may be bent. The first adjacent area A1 may be adjacent to the central area CA in the first direction (e.g., the x direction or the −x direction). The first adjacent area A1 may be defined as an area bent from the central area CA in the cross-section (e.g., the xz cross-section) in the first direction (e.g., the x direction or the −x direction). The first adjacent area A1 may extend in the second direction (e.g., the y direction or the −y direction). In other words, the first adjacent area A1 may not be bent in the cross-section (e.g., the yz cross-section) in the second direction (e.g., the y direction or the −y direction). The first adjacent area A1 may be an area bent with respect to the axis extending in the second direction (e.g., the y direction or the −y direction). FIG. 2A illustrates that the first adjacent area A1 bent while extending from the central area CA in the x direction and the first adjacent area A1 bent while extending from the central area CA in the −x direction have the same curvature as each other, but in another embodiment, the first adjacent area A1 bent while extending from the central area CA in the x direction and the first adjacent area A1 bent while extending from the central area CA in the −x direction have different curvatures from each other.

The second adjacent area A2 may be bent. The second adjacent area A2 may be adjacent to the central area CA in the second direction (e.g., the y direction or the −y direction). The second adjacent area A2 may be defined as an area bent from the central area CA in the cross-section (e.g., the yz cross-section) in the second direction (e.g., the y direction or the −y direction). The second adjacent area A2 may extend in the first direction (e.g., the x direction or the −x direction). In other words, the second adjacent area A2 may not be bent in the cross-section (e.g., the xz cross-section) in the first direction (e.g., the x direction or the −x direction). The second adjacent area A2 may be an area bent with respect to the axis extending in the first direction (e.g., the x direction or the −x direction). FIG. 2B illustrates that the second adjacent area A2 bent while extending from the central area CA in the y direction and the second adjacent area A2 bent while extending from the central area CA in the −y direction have the same curvature as each other, but in another embodiment, the second adjacent area A2 bent while extending from the central area CA in the y direction and the second adjacent area A2 bent while extending from the central area CA in the −y direction have different curvatures from each other.

FIGS. 1 and 2A to 2C illustrate that the display panel 10 includes two first adjacent areas A1 and two second adjacent areas A2, but in another embodiment, the display panel 10 may have five or more curved surfaces including the first adjacent area A1, the second adjacent area A2, and the third adjacent area. Hereinafter, a case in which the display panel 10 includes two first adjacent areas A1 and two second adjacent areas A2 will be described in detail.

The corner area CNA may be bent. In an embodiment, a corner CN in which the edge in the first direction (e.g., the x direction or the −x direction) meets the edge in the second direction (e.g., the y direction or the −y direction) may have a certain curvature. The corner area CNA may be an area arranged at the corner CN. In an embodiment, the corner area CNA may be an area in which the edge of the display device 1 in the first direction (e.g., the x direction or the −x direction) meets the edge of the display device 1 in the second direction (e.g., the y direction or the −y direction). In an embodiment, the corner area CNA may at least partially surround the central area CA, the first adjacent area A1, and the second adjacent area A2. When the first adjacent area A1 is bent while extending in the first direction (e.g., the x direction or the −x direction) and the second adjacent area A2 is bent while extending in the second direction (e.g., the y direction or the −y direction), at least a portion of the corner area CNA may be bent while extending in the first direction (e.g., the x direction or the −x direction) and may be bent while extending in the second direction (e.g., the y direction or the −y direction). In other words, at least a portion of the corner area CNA may be a double-curved area in which a plurality of curvatures in a plurality of directions overlap each other. In an embodiment, a plurality of corner areas CNA may be provided.

The corner area CNA may include an inner corner area ICNA and an outer corner area OCNA. The inner corner area ICNA may be between the outer corner area OCNA and the central area CA. In an embodiment, the inner corner area ICNA may extend between the first adjacent area A1 and the outer corner area OCNA. In an embodiment, the inner corner area ICNA may extend between the second adjacent area A2 and the outer corner area OCNA.

In an embodiment, the pixel PX may be in at least one of the first adjacent area A1, the second adjacent area A2, and the corner area CNA. For example, the pixel PX may be in the first adjacent area A1, the second adjacent area A2, and the corner area CNA. As another example, the pixel PX may be in the first adjacent area A1 and the second adjacent area A2, and the pixel PX may not be in the corner area CNA. As another example, the pixel PX may be in one of the first adjacent area A1 and the second adjacent area A2, the pixel PX may not be in the other of the first adjacent area A1 and the second adjacent area A2, and the pixel PX may not be in the corner area CNA. Hereinafter, a case in which the pixel PX is in the first adjacent area A1, the second adjacent area A2, and the corner area CNA will be described in detail.

In an embodiment, the corner area CNA may be omitted. In other words, the outer area OA may include a first adjacent area A1, a second adjacent area A2, and a peripheral area PA. In another embodiment, the outer area OA may include the first adjacent area A1 and the peripheral area PA. In another embodiment, the outer area OA may include the second adjacent area A2 and the peripheral area PA.

The peripheral area PA may be an area in which the pixel PX is not arranged. The peripheral area PA may include a first outer peripheral area OPA1, a second outer peripheral area OPA2, a third outer peripheral area OPA3, and a fourth outer peripheral area OPA4. The first outer peripheral area OPA1 and the third outer peripheral area OPA3 may be spaced apart from each other in the first direction (e.g., the x direction or the −x direction) with the central area CA therebetween. The first outer peripheral area OPA1 and the third outer peripheral area OPA3 may be outside the first adjacent area A1. In an embodiment, the first outer peripheral area OPA1 and the third outer peripheral area OPA3 may be outside the central area CA. The first outer peripheral area OPA1 and the third outer peripheral area OPA3 may be bent similarly to the first adjacent area A1.

The second outer peripheral area OPA2 and the fourth outer peripheral area OPA4 may be spaced apart from each other in the second direction (e.g., the y direction or the −y direction) with the central area CA therebetween. The second outer peripheral area OPA2 and the fourth outer peripheral area OPA4 may be outside the second adjacent area A2. In an embodiment, the second outer peripheral area OPA2 and the fourth outer peripheral area OPA4 may be outside the central area CA. The second outer peripheral area OPA2 and the fourth outer peripheral area OPA4 may be bent similarly to the second adjacent area A2.

The pixel PX may be implemented as a display element. In an embodiment, a plurality of pixels PX may be provided. The plurality of pixels PX may emit light to display an image. In an embodiment, each of the pixels PX may include a red sub-pixel, a green sub-pixel, and a blue sub-pixel. Alternatively, each of the pixels PX may include a red sub-pixel, a green sub-pixel, a blue sub-pixel, and a white sub-pixel.

The pixel PX may be in the central area CA. In an embodiment, the pixel PX may be in at least one of the central area CA, the first adjacent area A1, the second adjacent area A2, and the corner area CNA. In this case, the display device 1 may display an image in at least one of the central area CA, the first adjacent area A1, the second adjacent area A2, and the corner area CNA. Therefore, the proportion of the display area that displays an image in the display device 1 may increase. In addition, because the display device 1 displays an image in a state of being bent in the outer area OA, the aesthetic sense may be improved.

The cover window 20 may be on the display panel 10. The cover window 20 may protect the display panel 10. In an embodiment, the cover window 20 may be a flexible window. The cover window 20 may be easily bent according to an external force, without generating cracks, to protect the display panel 10. The cover window 20 may include glass, sapphire, or plastic. The cover window 20 may include, for example, ultra-thin glass or colorless polyimide.

Although not illustrated, the display panel 10 and the cover window 20 may be bonded to each other by a transparent adhesive member, such as an optically clear adhesive (OCA) film.

The cover panel 30 may be under the display panel 10. In other words, the display panel 10 may be between the cover window 20 and the cover panel 30. In an embodiment, the cover panel 30 may include a metal layer, an organic layer, a cushion layer, and a light blocking layer. The metal layer may have a function of shielding electromagnetic interference (EMI) and/or a function of dissipating heat. The metal layer may be a heat dissipation member for efficiently dissipating heat. For example, the metal layer may include a metal material having high thermal conductivity, such as copper nickel ferrite, silver, or aluminum.

The organic layer may include a synthetic resin film. In an embodiment, the organic layer may include a thermosetting resin.

The cushion layer may be a synthetic resin foam including a matrix member and a plurality of voids. The matrix member may include a flexible material. For example, the matrix member may include a synthetic resin. The plurality of voids may easily absorb an impact. The plurality of voids may be defined as the cushion layer having a porous structure. Therefore, the voids may be dispersed in the matrix member. The voids may allow the cushion layer to be easily deformed. Therefore, the impact resistance of the cover panel 30 may be increased by increasing the elasticity of the cushion layer.

The light blocking layer may block external light from being incident toward the display panel 10. In an embodiment, the light blocking layer may include at least one of a black dye and a black particle.

Figure 3:
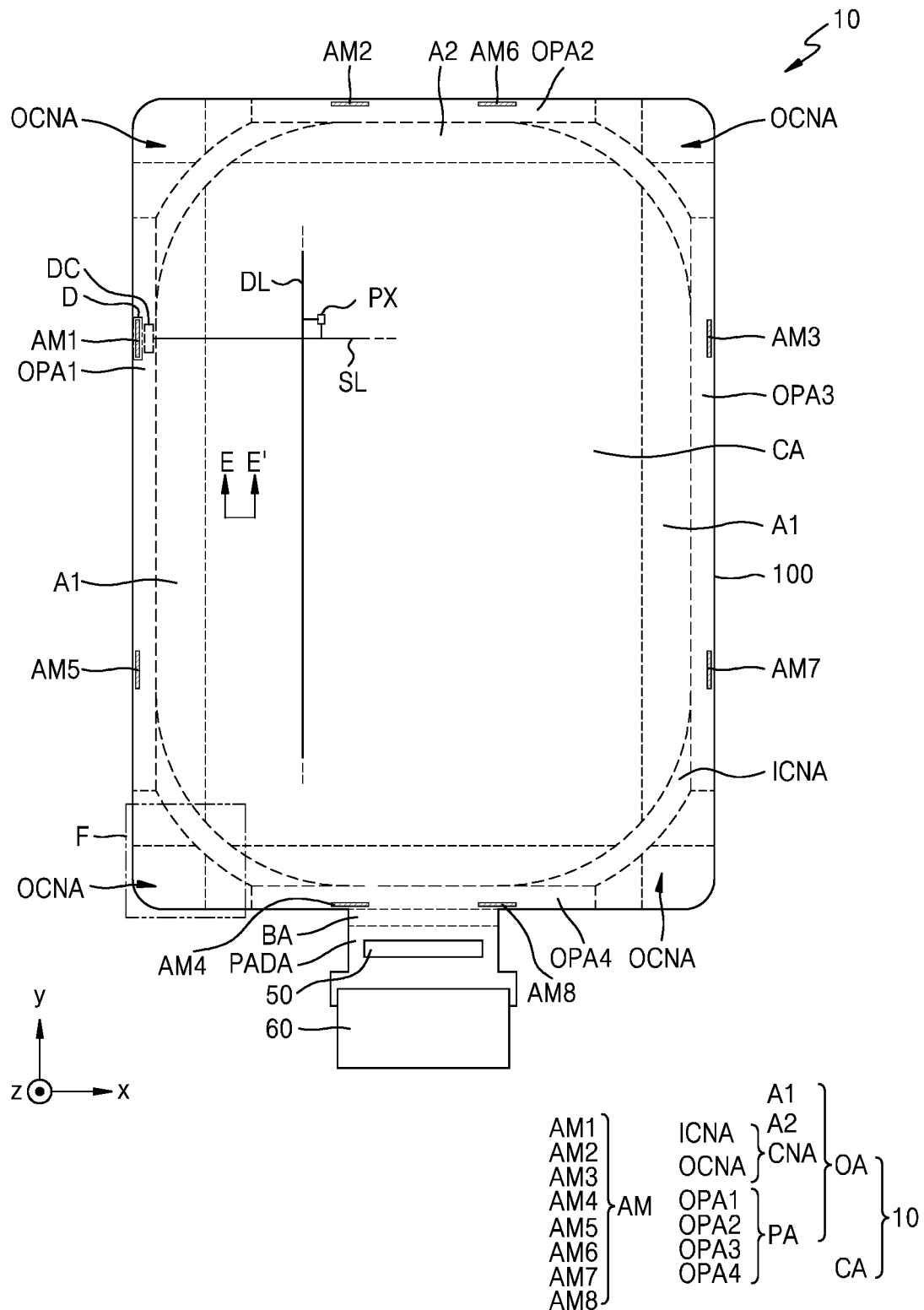
FIG. 3 is a plan view schematically illustrating a display panel according to an embodiment.

FIG. 3 is a plan view schematically illustrating a display panel 10 according to an embodiment. FIG. 3 is a plan view schematically illustrating a state in which the display panel 10 is unbent.

Referring to FIG. 3, the display panel 10 may display an image. The display panel 10 may include a central area CA, an outer area OA, a bending area BA, and a pad area PADA. The central area CA may be a flat area. The display panel 10 may provide most of the image in the central area CA. A plurality of pixels PX may be in the central area CA.

The outer area OA may be outside the central area CA. The outer area OA may at least partially surround the central area CA. In an embodiment, the outer area OA may completely surround the central area CA. The outer area OA may include a first adjacent area A1, a second adjacent area A2, a corner area CNA, and a peripheral area PA.

The first adjacent area A1 may be adjacent to the central area CA in the first direction (e.g., the x direction or the −x direction). The first adjacent area A1 may extend from the central area CA in the first direction (e.g., the x direction or the −x direction). The second adjacent area A2 may be adjacent to the central area CA in the second direction (e.g., the y direction or the −y direction). The second adjacent area A2 may extend from the central area CA in the second direction (e.g., the y direction or the −y direction).

The corner area CNA may be an area arranged at the corner of the display panel 10. In an embodiment, the corner area CNA may be an area in which the edge of the display panel 10 in the first direction (e.g., the x direction or the −x direction) meets the edge of the display panel 10 in the second direction (e.g., the y direction or the −y direction). In an embodiment, the corner area CNA may at least partially surround the central area CA, the first adjacent area A1, and the second adjacent area A2. The corner area CNA may include an inner corner area ICNA and an outer corner area OCNA.

The inner corner area ICNA may be between the outer corner area OCNA and the central area CA. In an embodiment, the inner corner area ICNA may extend between the first adjacent area A1 and the outer corner area OCNA. In an embodiment, the inner corner area ICNA may extend between the second adjacent area A2 and the outer corner area OCNA. The outer corner area OCNA may extend from the inner corner area ICNA. In an embodiment, the outer corner area OCNA may extend in a direction away from the central area CA.

The peripheral area PA may be an area in which the pixel PX is not arranged. In an embodiment, a driving circuit DC and/or a power supply line configured to provide an electrical signal to the pixel PX may be in the peripheral area PA. The peripheral area PA may be outside the first adjacent area A1 and the second adjacent area A2. In an embodiment, the peripheral area PA may include a first outer peripheral area OPA1, a second outer peripheral area OPA2, a third outer peripheral area OPA3, and a fourth outer peripheral area OPA4.

The first outer peripheral area OPA1 may be outside the central area CA. In an embodiment, the first outer peripheral area OPA1 may be outside the first adjacent area A1 extending in the −x direction.

The second outer peripheral area OPA2 may be outside the central area CA. In an embodiment, the second outer peripheral area OPA2 may be outside the second adjacent area A2 extending in the y direction.

The third outer peripheral area OPA3 may be outside the central area CA. In an embodiment, the third outer peripheral area OPA3 may be outside the first adjacent area A1 extending in the x direction. The third outer peripheral area OPA3 may be spaced apart from the first outer peripheral area OPA1 in the first direction (e.g., the x direction or the −x direction) with the central area CA therebetween.

The fourth outer peripheral area OPA4 may be outside the central area CA. In an embodiment, the fourth outer peripheral area OPA4 may be outside the second adjacent area A2 extending in the −y direction. The fourth outer peripheral area OPA4 may be spaced apart from the second outer peripheral area OPA2 in the second direction (e.g., in the y direction or the −y direction) with the central area CA therebetween.

An alignment mark AM may be provided in the display panel 10. The alignment mark AM may be for alignment with the display panel 10 and other elements attached to the display panel 10 in the process of manufacturing the display device. The alignment mark AM may be in the peripheral area PA. In an embodiment, the alignment mark AM may include a metal material in the display panel 10. In some embodiments, the alignment mark AM may be omitted. Hereinafter, a case in which the display panel 10 includes the alignment mark AM will be described in detail.

A plurality of alignment marks AM may be in the peripheral area PA. The plurality of alignment marks AM may include a first alignment mark AM1, a second alignment mark AM2, a third alignment mark AM3, a fourth alignment mark AM4, a fifth alignment mark AM5, a sixth alignment mark AM6, a seventh alignment mark AM7, and an eighth alignment mark AM8.

The first alignment mark AM1 may be provided in the first outer peripheral area OPA1. The first alignment mark AM1 may be arranged along the edge of the first outer peripheral area OPA1.

The second alignment mark AM2 may be provided in the second outer peripheral area OPA2. The second alignment mark AM2 may be arranged along the edge of the second outer peripheral area OPA2.

The third alignment mark AM3 may be provided in the third outer peripheral area OPA3. The third alignment mark AM3 may be arranged along the edge of the third outer peripheral area OPA3. In an embodiment, the third alignment mark AM3 may be spaced apart from the first alignment mark AM1 in the first direction (e.g., the x direction or the −x direction).

The fourth alignment mark AM4 may be provided in the fourth outer peripheral area OPA4. The fourth alignment mark AM4 may be arranged along the edge of the fourth outer peripheral area OPA4. In an embodiment, the fourth alignment mark AM4 may be spaced apart from the second alignment mark AM2 in the second direction (e.g., the y direction or the −y direction).

The fifth alignment mark AM5 may be provided in the first outer peripheral area OPA1. The fifth alignment mark AM5 may be arranged along the edge of the first outer peripheral area OPA1. The fifth alignment mark AM5 may be spaced apart from the first alignment mark AM1 in the second direction (e.g., the y direction or the −y direction).

The sixth alignment mark AM6 may be provided in the second outer peripheral area OPA2. The sixth alignment mark AM6 may be arranged along the edge of the second outer peripheral area OPA2. The sixth alignment mark AM6 may be spaced apart from the second alignment mark AM2 in the first direction (e.g., the x direction or the −x direction).

The seventh alignment mark AM7 may be provided in the third outer peripheral area OPA3. The seventh alignment mark AM7 may be arranged along the edge of the third outer peripheral area OPA3. The seventh alignment mark AM7 may be spaced apart from the third alignment mark AM3 in the second direction (e.g., the y direction or the −y direction). In an embodiment, the seventh alignment mark AM7 may be spaced apart from the fifth alignment mark AM5 in the first direction (e.g., the x direction or the −x direction).

The eighth alignment mark AM8 may be provided in the fourth outer peripheral area OPA4. The eighth alignment mark AM8 may be arranged along the edge of the fourth outer peripheral area OPA4. The eighth alignment mark AM8 may be spaced apart from the fourth alignment mark AM4 in the first direction (e.g., the x direction or the −x direction). The eighth alignment mark AM8 may be spaced apart from the sixth alignment mark AM6 in the second direction (e.g., the y direction or the −y direction).

The bending area BA may be outside the peripheral area PA. In an embodiment, the bending area BA may be outside the fourth outer peripheral area OPA4. In other words, the bending area BA may be between the fourth outer peripheral area OPA4 and the pad area PADA. A pad (not illustrated) may be in the pad area PADA. Also, at least one of a driving chip 50 and a printed circuit board (PCB) 60 electrically connected through the pad may be in the pad area PADA. The display panel 10 may receive an electrical signal and/or a power supply voltage from the driving chip 50 and the PCB 60 through the pad. At least one of the driving chip 50 and the PCB 60 may be electrically connected to the pad through an anisotropic conductive film. The driving chip 50 may include an integrated circuit (IC). Examples of the PCB 60 may include a flexible PCB (FPCB) or a rigid PCB that is rigid and, thus, is hardly bent. Alternatively, in some cases, examples of the PCB 60 may include a composite PCB including both a rigid PCB and an FPCB. In an embodiment, a chip including an IC may be on the PCB 60.

The outer area OA may be bent. In an embodiment, at least one of the first adjacent area A1, the second adjacent area A2, the corner area CNA, and the peripheral area PA may be bent. For example, a portion of the first adjacent area A1 and the corner area CNA may be bent in the cross-section (e.g., the xz cross-section) in the first direction (e.g., the x direction or the −x direction). Another portion of the second adjacent area A2 and the corner area CNA may be bent in the cross-section (e.g., the yz cross-section) in the second direction (e.g., the y direction or the −y direction). Another portion of the corner area CNA may be bent in the cross-section (e.g., the xz section) in the first direction (e.g., the x direction or the −x direction) and may be bent in the cross-section (e.g., the yz cross-section) in the second direction (e.g., the y direction or the −y direction).

The pixel PX may be in at least one of the central area CA, the first adjacent area A1, the second adjacent area A2, and the corner area CNA. In an embodiment, the pixel PX may include a display element. In an embodiment, examples of the display element may include an organic light-emitting diode (LED) including an organic emission layer. Alternatively, examples of the display element may include an LED including an inorganic emission layer. The size of the LED may be on a micro-scale or a nano-scale. For example, examples of the LED may include a micro LED. Alternatively, examples of the LED may include a nanorod LED. The nanorod LED may include gallium nitride (GaN). In an embodiment, a color conversion layer may be on the nanorod LED. The color conversion layer may include quantum dots. Alternatively, examples of the display element may include a quantum dot LED including a quantum dot emission layer.

The pixel PX may include a plurality of sub-pixels. Each of the sub-pixels may emit light of a certain color by using the display element. In the present specification, the sub-pixel is a minimum unit for implementing an image and refers to an emission area. On the other hand, when an organic LED is employed as the display element, the emission area may be defined by an opening of a pixel defining layer. This will be described below.

A driving circuit DC may be configured to provide a signal to each of the pixels PX. In an embodiment, the driving circuit DC may be a scan driving circuit configured to provide a scan signal to each of the pixels PX through a scan line SL. Alternatively, the driving circuit DC may be a data driving circuit configured to provide a data signal to each of the pixels PX through a data line DL.

FIGS. 4A to 4D are enlarged views illustrating region D of the display panel 10 of FIG. 3, according to various embodiments.

Referring to FIGS. 4A to 4D, the display panel 10 may include the alignment mark. For example, the display panel 10 may include the first alignment mark AM1.

Figure 4A:
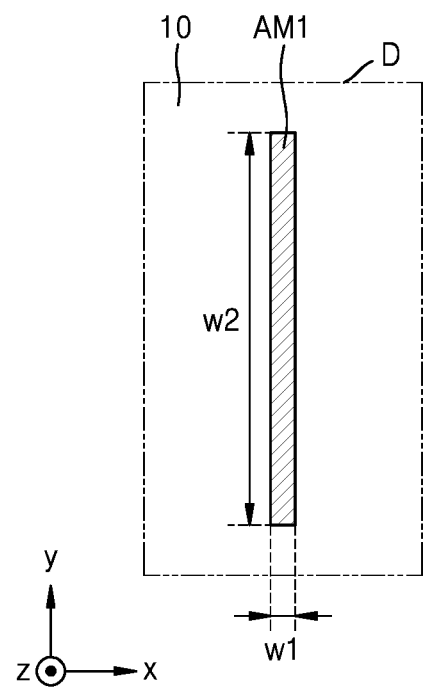
FIGS. 4A, 4B, 4C, and 4D are enlarged views illustrating region D of the display panel of FIG. 3, according to various embodiments.

Referring to FIG. 4A, the first alignment mark AM1 may have a rectangular shape having a first width w1 in the first direction (e.g., the x direction or the −x direction) and a second width w2 in the second direction (e.g., the y direction or the −y direction). The first width w1 may be a distance between edges of the first alignment marks AM1 spaced apart from each other in the first direction (e.g., the x direction or the −x direction). The second width w2 may be a distance between edges of the first alignment marks AM1 spaced apart from each other in the second direction (e.g., the y direction or the −y direction). In an embodiment, the second width w2 may be greater than the first width w1. Therefore, the first alignment mark AM1 may be clearly recognized and may function as an alignment mark. Also, even when the first outer peripheral area is bent respect to an axis extending in the second direction (e.g., the y direction or the −y direction), the position of the first alignment mark AM1 may not greatly change because the first width w1 is less than the second width w2.

Figure 4B:
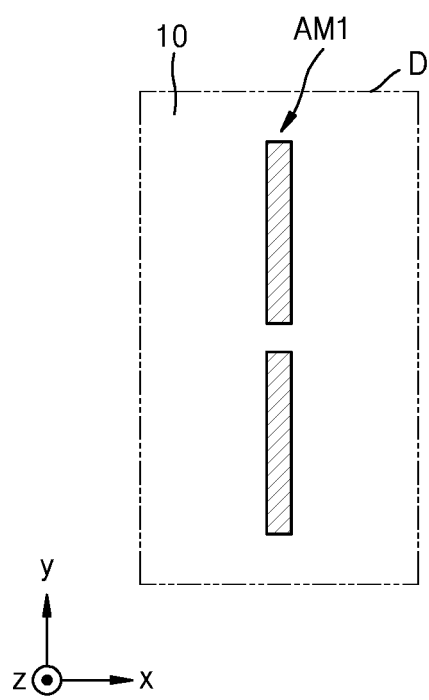
Figure 4C:
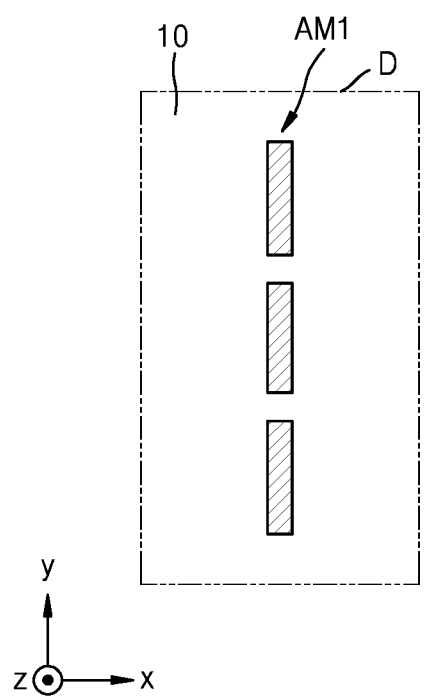

Referring to FIGS. 4B and 4C, a plurality of first alignment marks AM1 may be provided. The plurality of first alignment marks AM1 may be arranged side by side in the second direction (e.g., the y direction or the −y direction). Referring to FIG. 4B, two first alignment marks AM1 may be provided. Referring to FIG. 4C, three first alignment marks AM1 may be provided.

Figure 4D:
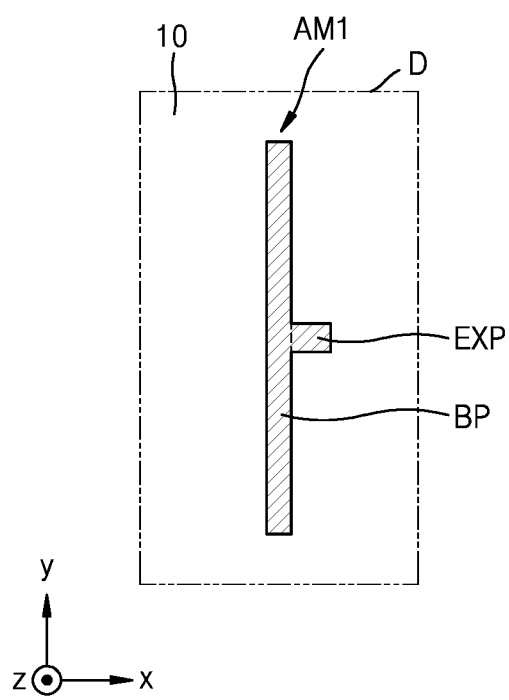

Referring to FIG. 4D, the first alignment mark AM1 may include a body portion BP extending in the second direction (e.g., the y direction or the −y direction) and an extension portion EXP extending in the first direction (e.g., the x direction or the −x direction). In this case, the first alignment mark AM1 may have a T-shape.

Although FIGS. 4A to 4D illustrate the first alignment mark AM1, the description of the first alignment mark AM1 may be applied to the second to eighth alignment marks in the same or similar manner.

Figure 5:
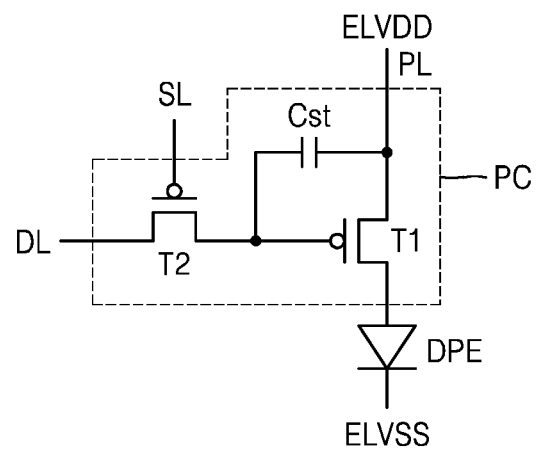
FIG. 5 is an equivalent circuit diagram schematically illustrating a pixel circuit applicable to the display panel.

FIG. 5 is an equivalent circuit diagram schematically illustrating a pixel circuit PC applicable to the display panel.

Referring to FIG. 5, the pixel circuit PC may be electrically connected to a display element DPE. The pixel circuit PC may include a driving thin-film transistor T1, a switching thin-film transistor T2, and a storage capacitor Cst. In an embodiment, the display element DPE may emit red light, green light, or blue light, or may emit red light, green light, blue light, or white light.

The switching thin-film transistor T2 may be connected to a scan line SL and a data line DL, and may be configured to transmit, to the driving thin-film transistor T1, a data signal input from the data line DL in response to a scan signal input from the scan line SL.

The storage capacitor Cst may be connected to the switching thin-film transistor T2 and a driving voltage line PL, and may be configured to store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may be configured to control a driving current flowing from the driving voltage line PL to the display element DPE according to a voltage value stored in the storage capacitor Cst. The display element DPE may emit light having a certain luminance according to the driving current. An opposite electrode of the display element DPE may be configured to receive a second power supply voltage ELVSS.

Although FIG. 5 illustrates that the pixel circuit PC includes two thin-film transistors and one storage capacitor, the pixel circuit PC may include three or more thin-film transistors.

Figure 6:
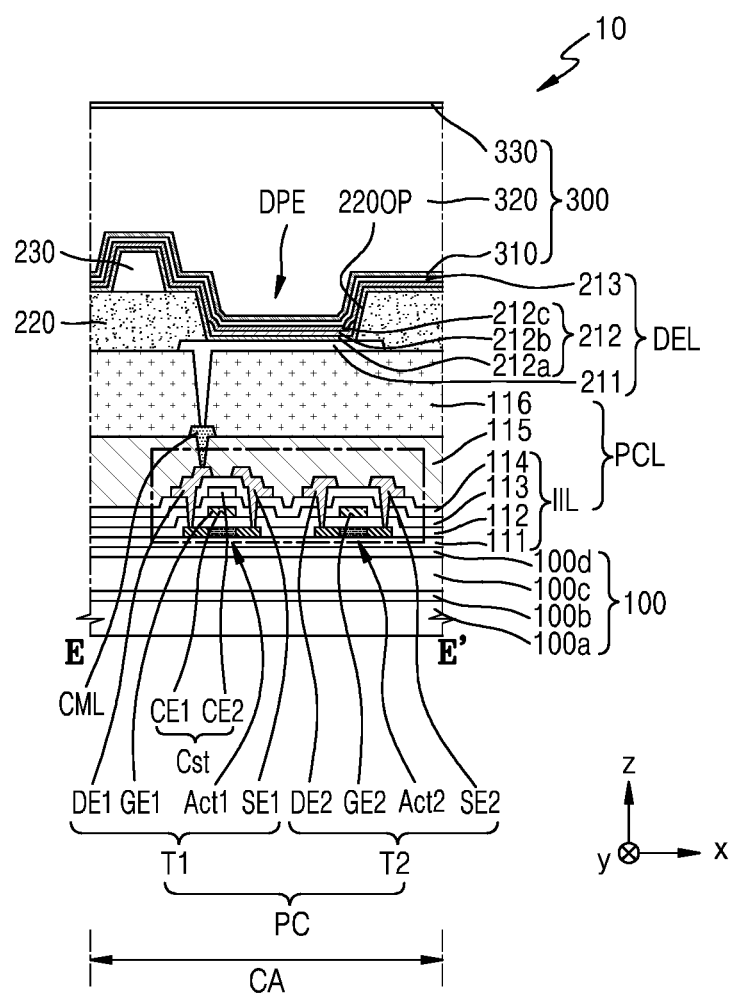
FIG. 6 is a schematic cross-sectional view of the display panel taken along line E-E' of FIG. 3.

FIG. 6 is a schematic cross-sectional view of the display panel 10 taken along line E-E' of FIG. 3.

Referring to FIG. 6, the display panel 10 may include a substrate 100, a pixel circuit layer PCL, a display element layer DEL, and an encapsulation layer 300. The substrate 100 may include a central area CA. In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked and provided in the substrate 100. In another embodiment, the substrate 100 may include glass.

At least one of the first base layer 100a and the second base layer 100c may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d are barrier layers configured to prevent infiltration of foreign matter, and may include a single layer or layers including an inorganic material, such as silicon nitride ($SiN_x$), silicon oxide ($SiO_2$), and/or silicon oxynitride (SiON).

The pixel circuit layer PCL may be on the substrate 100. The pixel circuit layer PCL may include a pixel circuit PC. The pixel circuit PC may be on the central area CA. The pixel circuit PC may include a driving thin-film transistor T1, a switching thin-film transistor T2, and a storage capacitor Cst. In an embodiment, the driving thin-film transistor T1 may include a first semiconductor layer Act1, a first gate electrode GE1, a first source electrode SE1, and a first drain electrode DE1. In an embodiment, the switching thin-film transistor T2 may include a second semiconductor layer Act2, a second gate electrode GE2, a second source electrode SE2, and a second drain electrode DE2. Because the second semiconductor layer Act2, the second gate electrode GE2, the second source electrode SE2, and the second drain electrode DE2 are respectively similar to the first semiconductor layer Act1, the first gate electrode GE1, the first source electrode SE1, and the first drain electrode DE1, detailed descriptions thereof are omitted.

The pixel circuit layer PCL may further include an inorganic insulating layer IIL, a first insulating layer 115, and a second insulating layer 116 below and/or above the elements of the pixel circuit PC. The inorganic insulating layer IIL may include a buffer layer 111, a first gate insulating layer 112, a second gate insulating layer 113, and an interlayer insulating layer 114.

The buffer layer 111 may be on the substrate 100. The buffer layer 111 may include an inorganic insulating material such as silicon nitride ($SiN_x$), silicon oxynitride (SiON), and silicon oxide ($SiO_2$), and may include a single layer or layers including the above-described inorganic insulating material.

The first semiconductor layer Act1 may be on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel region, and a drain region and a source region on both sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), titanium (Ti), and the like, and may include a single layer or layers including the above-described conductive material.

The first gate insulating layer 112 between the first semiconductor layer Act1 and the first gate electrode GE1 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, zinc oxide may be ZnO and/or $ZnO_2$.

The second gate insulating layer 113 may cover the first gate electrode GE1. Similar to the first gate insulating layer 112, the second gate insulating layer 113 may include an inorganic insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

An upper electrode CE2 of the storage capacitor Cst may be on the second gate insulating layer 113. The upper electrode CE2 may overlap the first gate electrode GE1 therebelow. In this case, the first gate electrode GE1 of the driving thin-film transistor T1 and the upper electrode CE2 overlapping each other with the second gate insulating layer 113 therebetween may constitute the storage capacitor Cst. That is, the first gate electrode GE1 of the driving thin-film transistor T1 may function as the lower electrode CE1 of the storage capacitor Cst. In other words, the storage capacitor Cst may overlap the driving thin-film transistor T1. In some embodiments, the storage capacitor Cst may not overlap the driving thin-film transistor T1. The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the above-described material.

The interlayer insulating layer 114 may cover the upper electrode CE2. The interlayer insulating layer 114 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The interlayer insulating layer 114 may include a single layer or layers including the above-described inorganic insulating material.

The first drain electrode DE1 and the first source electrode SE1 may be on the interlayer insulating layer 114. The first drain electrode DE1 and the first source electrode SE1 may include a material having high conductivity. The first drain electrode DE1 and the first source electrode SE1 may include a conductive material including molybdenum (Mo), aluminum (Al), copper (Cu), titanium (Ti), and the like, and may include a single layer or layers including the above-described conductive material. In an embodiment, the first drain electrode DE1 and the first source electrode SE1 may have a multilayer structure of Ti/Al/Ti.

The first insulating layer 115 may be on the first drain electrode DE1, the first source electrode SE1, the second drain electrode DE2, the second source electrode SE2, and the interlayer insulating layer 114. In an embodiment, the first insulating layer 115 may include an organic material. For example, the first insulating layer 115 may include an organic material selected from a general-purpose polymer, such as polymethylmethacrylate (PMMA) or polystyrene (PS), polymer derivatives having a phenolic group, an acrylic polymer, an imide polymer, an aryl ether polymer, an amide polymer, a fluorine polymer, a p-xylene polymer, a vinyl alcohol polymer, and any blend thereof.

A connection electrode CML may be on the first insulating layer 115. The connection electrode CML may be electrically connected to the pixel circuit PC through a hole in the first insulating layer 115. In an embodiment, the connection electrode CML may be electrically connected to the first drain electrode DE1 or the first source electrode SEL. The connection electrode CML may include a material having high conductivity. The connection electrode CML may include a conductive material including molybdenum (Mo), aluminum (Al), copper (Cu), titanium (Ti), and the like, and may include a single layer or layers including the above-described conductive material. In an embodiment, the connection electrode CML may have a multilayer structure of Ti/Al/Ti.

The second insulating layer 116 may be on the first insulating layer 115 and the connection electrode CML. In an embodiment, the second insulating layer 116 may include an organic material. The second insulating layer 116 may include an organic insulating material selected from a general-purpose polymer, such as polymethylmethacrylate (PMMA) or polystyrene (PS), polymer derivatives having a phenolic group, an acrylic polymer, an imide polymer, an aryl ether polymer, an amide polymer, a fluorine polymer, a p-xylene polymer, a vinyl alcohol polymer, and any blend thereof.

The display element layer DEL may be on the pixel circuit layer PCL. The display element layer DEL may include a display element DPE, a pixel defining layer 220, and a spacer 230. In an embodiment, examples of the display element DPE may include an organic LED. The display element DPE may be electrically connected to the connection electrode CML through a hole in the second insulating layer 116. The display element DPE may include a pixel electrode 211, an intermediate layer 212, and an opposite electrode 213. In an embodiment, the display element DPE in the central area CA may overlap the pixel circuit PC in the central area CA.

The pixel electrode 211 may be on the second insulating layer 116. The pixel electrode 211 may be electrically connected to the connection electrode CML through a hole in the second insulating layer 116. The pixel electrode 211 may include a conductive oxide, such as indium tin oxide (ITO), indium zinc oxide (IZO), ZnO, indium oxide ($In_2O_3$), indium gallium oxide (IGO), or aluminum zinc oxide (AZO). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In another embodiment, the pixel electrode 211 may further include a layer including ITO, IZO, ZnO, or $In_2O_3$ above and/or below the reflective layer.

The pixel defining layer 220 may be on the pixel electrode 211 and may have an opening 2200P exposing a central portion of the pixel electrode 211. The opening 2200P may define an emission area of light emitted from the display element DPE. For example, the width of the opening 2200P may correspond to the width of the emission area. Also, the width of the opening 2200P may correspond to the width of the sub-pixel.

In an embodiment, the pixel defining layer 220 may include an organic insulating material. In another embodiment, the pixel defining layer 220 may include an inorganic insulating material, such as silicon nitride (SiNx), silicon oxynitride (SiON), and silicon oxide ($SiO_2$). In another embodiment, the pixel defining layer 220 may include an organic insulating material and an inorganic insulating material. In some embodiments, the pixel defining layer 220 may include a light blocking material, and may be provided in black. The light blocking layer may include carbon black, carbon nanotubes, a resin or paste including black dye, metal particles (e.g., nickel, aluminum, molybdenum, and any alloy thereof), metal oxide particles (e.g., chromium oxide), or metal nitride particles (e.g., chromium nitride). When the pixel defining layer 220 includes a light blocking material, the reflection of external light due to the metal structures below the pixel defining layer 220 may be reduced.

The spacer 230 may be on the pixel defining layer 220. The spacer 230 may be used to prevent damage to the substrate 100 and/or the multilayer layer on the substrate 100 in the method of manufacturing the display device. When manufacturing the display panel 10, a mask sheet may be used. At this time, the mask sheet may enter the opening 2200P of the pixel defining layer 220, or may be in close contact with the pixel defining layer 220. The spacer 230 may prevent or reduce defects in which a portion of the substrate 100 and a portion of the multilayer layer are damaged by the mask sheet when a deposition material is deposited on the substrate 100.

The spacer 230 may include an organic material, such as polyimide. Alternatively, the spacer 230 may include an inorganic insulating material, such as silicon nitride (SiNx) or silicon oxide ($SiO_2$), or may include an organic insulating material and an inorganic insulating material. In an embodiment, the spacer 230 may include a material different from that of the pixel defining layer 220. Alternatively, in another embodiment, the spacer 230 may include the same material as that of the pixel defining layer 220. In this case, the pixel defining layer 220 and the spacers 230 may be formed together in a mask process using a halftone mask or the like.

The intermediate layer 212 may be on the pixel defining layer 220. The intermediate layer 212 may include an emission layer 212b in the opening 2200P of the pixel defining layer 220. The emission layer 212b may include a high molecular weight organic material or a low molecular weight organic material that emits light of a certain color.

The intermediate layer 212 may further include at least one of a first functional layer 212a between the pixel electrode 211 and the emission layer 212b and a second functional layer 212c between the emission layer 212b and the opposite electrode 213. In an embodiment, the first functional layer 212a and the second functional layer 212c may be below and above the emission layer 212b, respectively. The first functional layer 212a may include, for example, a hole transport layer (HTL), or may include an HTL and a hole injection layer (HIL). The second functional layer 212c may include an electron transport layer (ETL) and/or an electron injection layer (ELW). The first functional layer 212a and/or the second functional layer 212c may be a common layer completely covering the substrate 100 like the opposite electrode 213 to be described below.

The opposite electrode 213 may be on the intermediate layer 212. The opposite electrode 213 may include a conductive material having a low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 213 may further include a layer, such as ITO, IZO, ZnO, or $In_2O_3$, on the (semi)transparent layer including the above-described material.

In some embodiments, a capping layer (not illustrated) may be further on the opposite electrode 213. The capping layer may include LiF, an inorganic material, and/or an organic material.

The encapsulation layer 300 may be on the opposite electrode 213. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may include at least one inorganic material selected from aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride (SiNx), and silicon oxynitride (SiON). The organic encapsulation layer 320 may include a polymer-based material. The polymer-based material may include acrylic resin, epoxy-based resin, polyimide, polyethylene, and the like. In an embodiment, the organic encapsulation layer 320 may include acrylate.

A touch sensor layer may be on the encapsulation layer 300. The touch sensor layer may obtain coordinate information according to an external input, for example, a touch event.

An anti-reflection layer may be on the touch sensor layer. The anti-reflection layer may reduce the reflectance of light incident toward the display panel 10. In an embodiment, the anti-reflection layer may include a retarder and/or a polarizer. The retarder may be a film-type retarder or a liquid crystal coating-type retarder, and may include a $\lambda/2$ retarder and/or a $\lambda/4$ retarder. The polarizer may also be a film-type polarizer or a liquid crystal coating-type polarizer. The film-type polarizer may include a stretched synthetic resin film, and the liquid crystal coating-type polarizer may include liquid crystals arranged in a certain array. The retarder and the polarizer may further include a protective film.

In another embodiment, the anti-reflection layer may include a black matrix and color filters. The color filters may be arranged, taking into account the color of light emitted from each of the display elements DPE of the display panel 10. Each of the color filters may include a red, green, or blue pigment or dye. Alternatively, each of the color filters may further include, in addition to the pigment or dye, quantum dots. Alternatively, some color filters may not include the pigment or dye described above, and may include scattering particles, such as titanium oxide.

In another embodiment, the anti-reflection layer may include a destructive interference structure. The destructive interference structure may include a first reflective layer and a second reflective layer on different layers from each other. First reflected light and second reflected light respectively reflected from the first reflective layer and the second reflective layer may destructively interfere with each other, and thus, the reflectance of external light may be reduced.

Figure 7:
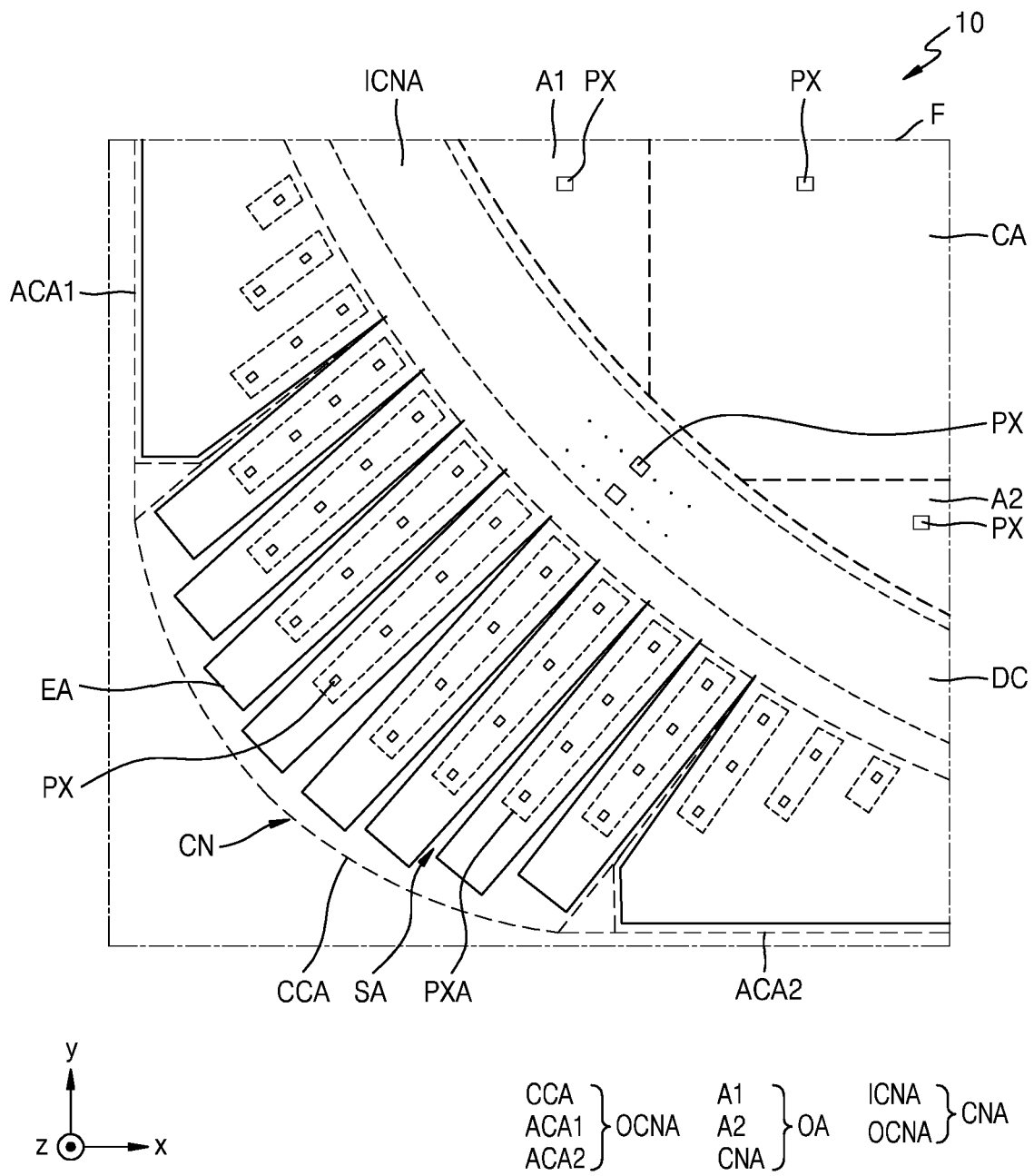
FIG. 7 is an enlarged view of region F of the display panel of FIG. 3.

FIG. 7 is an enlarged view of region F of the display panel 10 of FIG. 3. In FIG. 7, the same reference numerals as those in FIG. 3 refer to the same members, and redundant descriptions thereof are omitted.

Referring to FIG. 7, the display panel 10 may include a central area CA and an outer area OA. The central area CA may be a flat area.

The outer area OA may be outside the central area CA. The outer area OA may at least partially surround the central area CA. In an embodiment, the outer area OA may completely surround the central area CA. The outer area OA may include a first adjacent area A1, a second adjacent area A2, and a corner area CNA.

The first adjacent area A1 may be adjacent to the central area CA in the first direction (e.g., the x direction or the −x direction). The second adjacent area A2 may be adjacent to the central area CA in the second direction (e.g., the y direction or the −y direction).

The corner area CNA may be an area arranged at the corner CN of the display panel 10. In an embodiment, the corner area CNA may be an area in which the edge of the display panel 10 in the first direction (e.g., the x direction or the −x direction) meets the edge of the display panel 10 in the second direction (e.g., the y direction or the −y direction). In an embodiment, the corner area CNA may at least partially surround the central area CA, the first adjacent area A1, and the second adjacent area A2. The corner area CNA may include an inner corner area ICNA and an outer corner area OCNA.

The inner corner area ICNA may be between the outer corner area OCNA and the central area CA. In an embodiment, the inner corner area ICNA may extend between the first adjacent area A1 and the outer corner area OCNA. In an embodiment, the inner corner area ICNA may extend between the second adjacent area A2 and the outer corner area OCNA.

The outer corner area OCNA may be outside the inner corner area ICNA. In an embodiment, the outer corner area OCNA may include a central corner area CCA, a first adjacent corner area ACA1, and a second adjacent corner area ACA2.

The central corner area CCA may include an extension area EA. The extension area EA may extend in a direction away from the central area CA. In an embodiment, a plurality of extension areas EA may be provided. The plurality of extension areas EA may each extend in a direction away from the central area CA. In an embodiment, the plurality of extension areas EA may extend in a direction crossing the first direction (e.g., the x direction or the −x direction) and the second direction (e.g., the y direction or the −y direction).

A separation area SA may be defined between the adjacent extension areas EA of the plurality of extension areas EA. The separation area SA may be an area in which elements of the display panel 10 are not arranged. When the central corner area CCA is bent at the corner CN, a compressive strain may be greater than a tensile strain in the central corner area CCA. In the present embodiment, because the separation area SA is defined between the adjacent extension areas EA, the central corner area CCA may be contracted. Therefore, the display panel may be bent without being damaged in the central corner area CCA.

The first adjacent corner area ACA1 may be adjacent to the central corner area CCA. In an embodiment, at least a portion of the first adjacent area A1 and the first adjacent corner area ACA1 may be arranged in the first direction (e.g., the x direction or the −x direction). An end of the adjacent central corner area CCA and an end of the first adjacent corner area ACA1 may be spaced apart from each other. The first adjacent corner area ACA1 is an area that is bent in the cross-section (e.g., the xz section) in the first direction (e.g., the x direction or the −x direction) and is not bent in the cross-section (e.g., the yz section) in the second direction (e.g., the y direction or the −y direction), and the separation area SA may not be defined inside the first adjacent corner area ACA1.

The second adjacent corner area ACA2 may be adjacent to the central corner area CCA. At least a portion of the second adjacent area A2 may be between the central area CA and the second adjacent corner area ACA2 in the second direction (e.g., the y direction or the −y direction). An end of the adjacent central corner area CCA and an end of the second adjacent corner area ACA2 may be spaced apart from each other. The second adjacent corner area ACA2 is an area that is not bent in the cross-section (e.g., the xz section) in the first direction (e.g., the x direction or the −x direction) and is bent in the cross-section (e.g., the yz section) in the second direction (e.g., the y direction or the −y direction), and the separation area SA may not be defined inside the second adjacent corner area ACA2.

The plurality of pixels PX may be in the central area CA, the first adjacent area A1, the second adjacent area A2, and the corner area CNA. Therefore, the display panel 10 may display an image in the central area CA, the first adjacent area A1, the second adjacent area A2, and the corner area CNA. In an embodiment, each of the extension areas EA may include a pixel area PXA, and the pixel PX may be in the pixel area PXA. The plurality of pixels PX may be arranged along the extending direction of the plurality of extension areas EA.

In an embodiment, a driving circuit DC configured to provide an electrical signal to the pixel PX and/or a power line configured to provide power may be in the inner corner area ICNA. A plurality of driving circuits DC may be provided. The plurality of driving circuits DC may be arranged along the extending direction of the inner corner area ICNA. The plurality of driving circuits DC may be arranged to at least partially surround the central area CA, the first adjacent area A1, and the second adjacent area A2.

The pixel PX in the inner corner area ICNA may overlap the driving circuit DC and/or the power line. In this case, the inner corner area ICNA may function as a display area even when the driving circuit DC and/or power line are arranged. In another embodiment, the driving circuit DC and/or the power line may not be in the inner corner area ICNA. In this case, the pixel PX in the inner corner area ICNA may not overlap the driving circuit DC and/or the power line.

FIG. 8 is a diagram schematically illustrating an apparatus 1000 for manufacturing a display device, according to an embodiment.

Referring to FIG. 8, the apparatus 1000 for manufacturing a display device may include a photographing member 1100, a control member 1200, a backlight member 1300, and an optical member 1400. The photographing member 1100 may be configured to photograph a display panel 10 and/or a cover window 20. In an embodiment, the photographing member 1100 may be configured to photograph an alignment mark AM provided in the display panel 10. In an embodiment, the photographing member 1100 may be configured to photograph the edge of the display panel 10. In an embodiment, the photographing member 1100 may be configured to photograph the edge of the cover window 20.

The photographing member 1100 may be configured to photograph the display panel 10 in a plan view. In other words, the photographing member 1100 may be configured to photograph the display panel 10 in the z direction or the −z direction of FIG. 8. In an embodiment, the photographing member 1100 may be a vision part. Examples of the photographing member 1100 may include a camera.

Figure 15B:
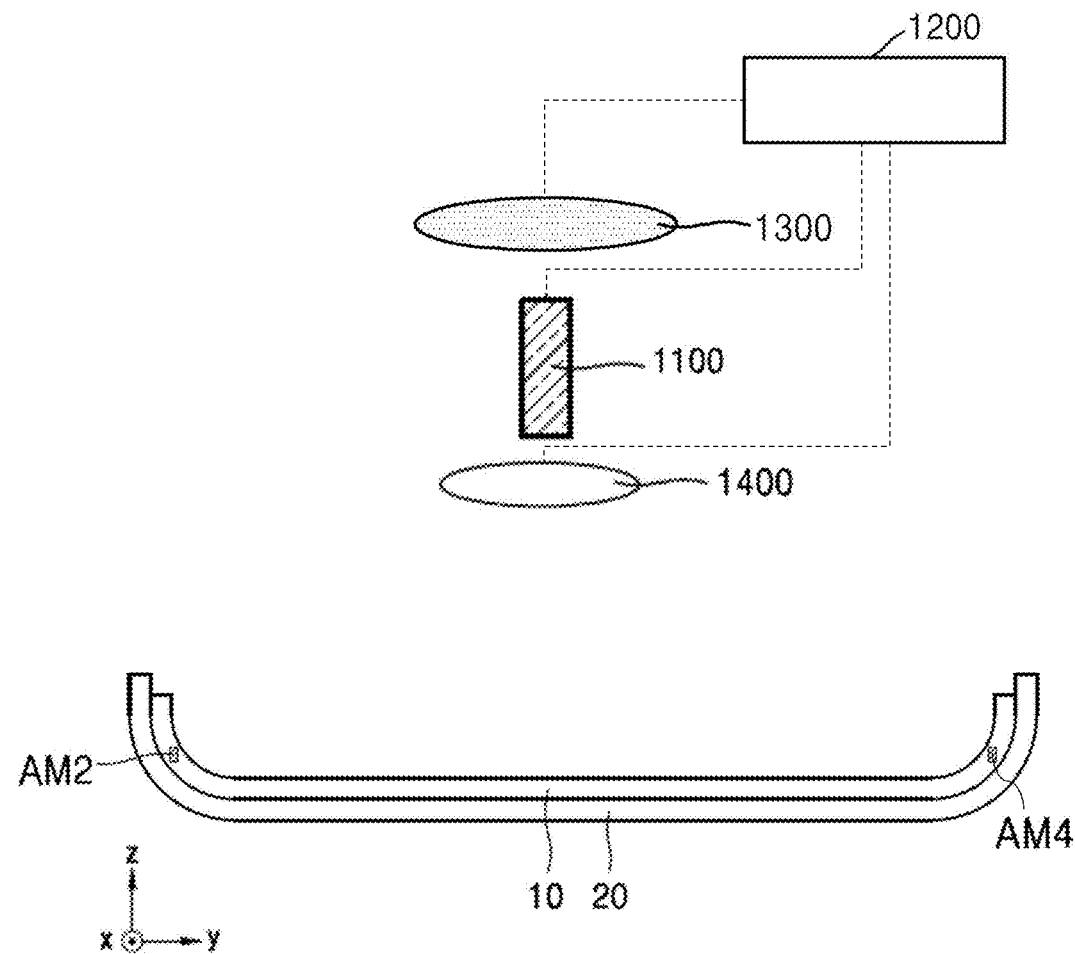

In an embodiment, a plurality of photographing members 1100 may be provided. In another embodiment, a single photographing member 1100 may be provided as shown in FIGS. 15A and 15B. Referring to FIGS. 15A and 15B, the apparatus 1000 for manufacturing a display device may include a photographing member 1100, a control member 1200, a backlight member 1300, and an optical member 1400. The photographing member 1100 may be configured to photograph a display panel 10 and/or a cover window 20. In the embodiment shown in FIGS. 15A and 15B, the photographing member 1100 may be configured to photograph a first alignment mark AM1, a second alignment mark AM2, a third alignment mark AM3, and a fourth alignment mark AM4 provided in the display panel 10. The following description will be given focusing on a case in which a plurality of photographing members 1100 are provided.

The control member 1200 may be configured to set an imaginary reference point, taking into account data photographed by the photographing member 1100. For example, the photographing member 1100 may be configured to photograph the first alignment mark, the second alignment mark, the third alignment mark, and the fourth alignment mark, which are provided in the display panel 10. The control member 1200 may be configured to identify the first alignment mark, the second alignment mark, the third alignment mark, and the fourth alignment mark. The control member 1200 may be configured to set an imaginary reference point, taking into account the first alignment mark, the second alignment mark, the third alignment mark, and the fourth alignment mark. In an embodiment, the control member 1200 may form a first imaginary straight line connecting the first alignment mark to the third alignment mark, and a second imaginary straight line connecting the second alignment mark to the fourth alignment mark. Also, the control member 1200 may be configured to set a first position which is included in the imaginary reference point and at which the first imaginary straight line and the second imaginary straight line cross each other. In the apparatus 1000 for manufacturing a display device, according to the embodiment, the control member 1200 sets the imaginary reference point by using data photographed by the photographing member 1100. Therefore, the photographing member 1100 configured to perform photographing at various angles may not be required. Accordingly, the apparatus 1000 for manufacturing a display device may be simplified.

The control member 1200 may be configured to control the photographing member 1100. For example, the control member 1200 may be configured to control the photographing member 1100 to photograph an object. The control member 1200 may be configured to control the backlight member 1300. For example, the control member 1200 may be configured to control the backlight member 1300 to emit light.

The backlight member 1300 may be configured to emit light. In an embodiment, the backlight member 1300 and the photographing member 1100 may be adjacent to each other. The optical member 1400 may be between the object and the photographing member 1100. In an embodiment, the optical member 1400 may be between the display panel 10 and the photographing member 1100. The optical member 1400 may be configured to control a path of light incident on the photographing member 1100. The optical member 1400 may include at least one of a lens and a mirror. Therefore, the photographing member 1100 may clearly recognize the display panel 10 and the cover window 20.

Hereinafter, a process of manufacturing a display device by using the apparatus 1000 for manufacturing a display device will be described in detail.

Figure 9A:
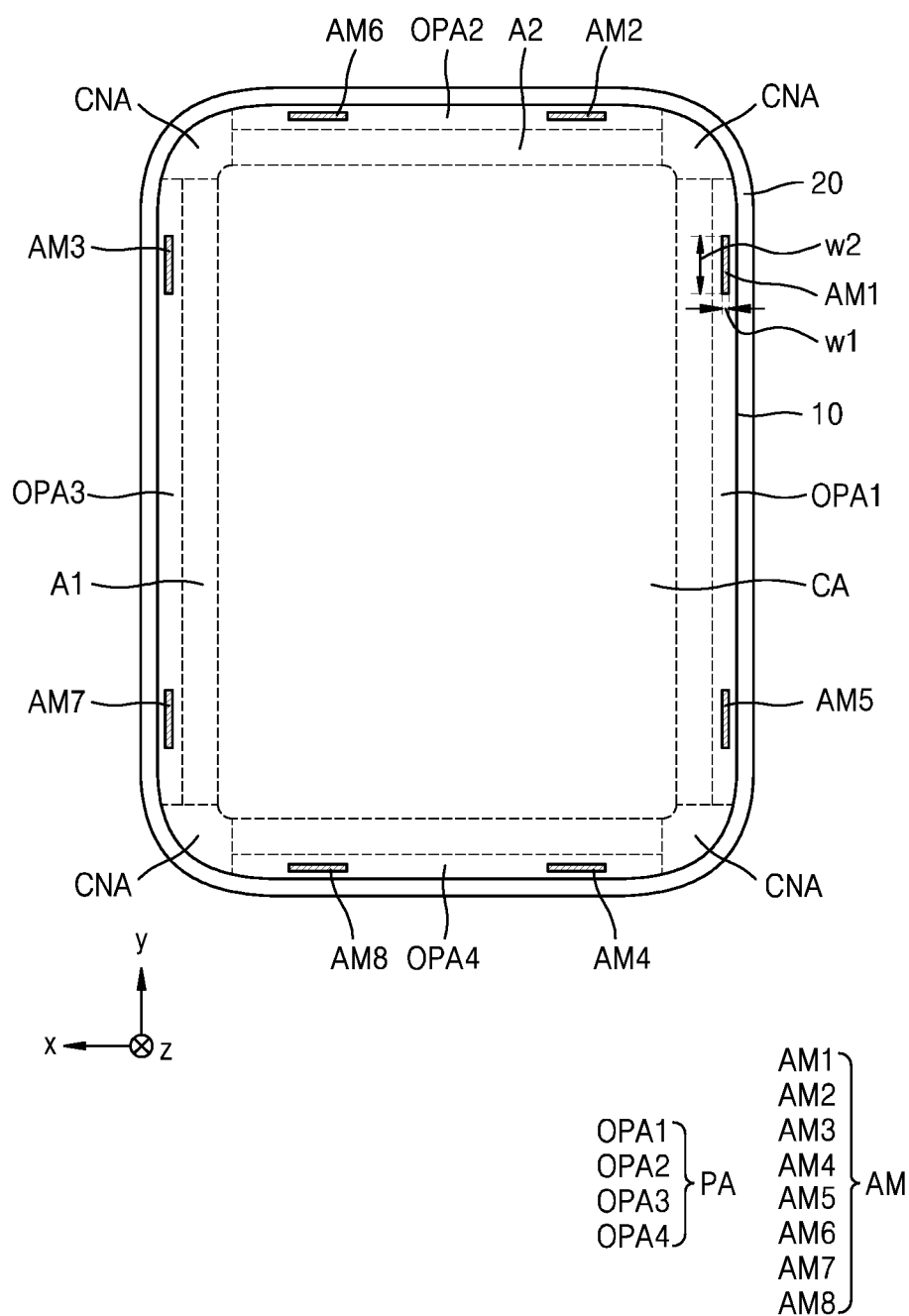
FIGS. 9A and 9B are plan views schematically illustrating a method of manufacturing a display device, according to an embodiment.
Figure 9B:
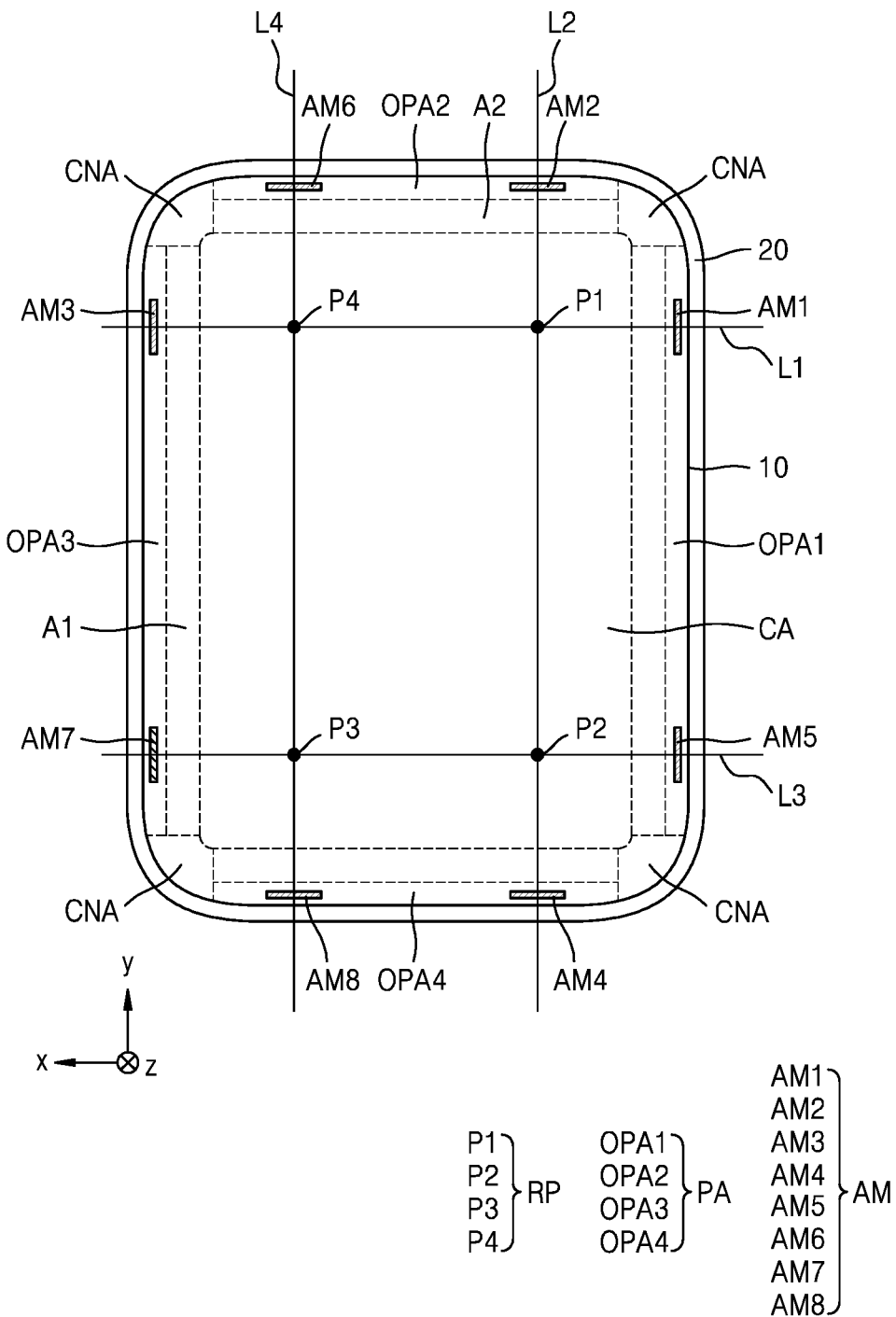
Figure 9C:
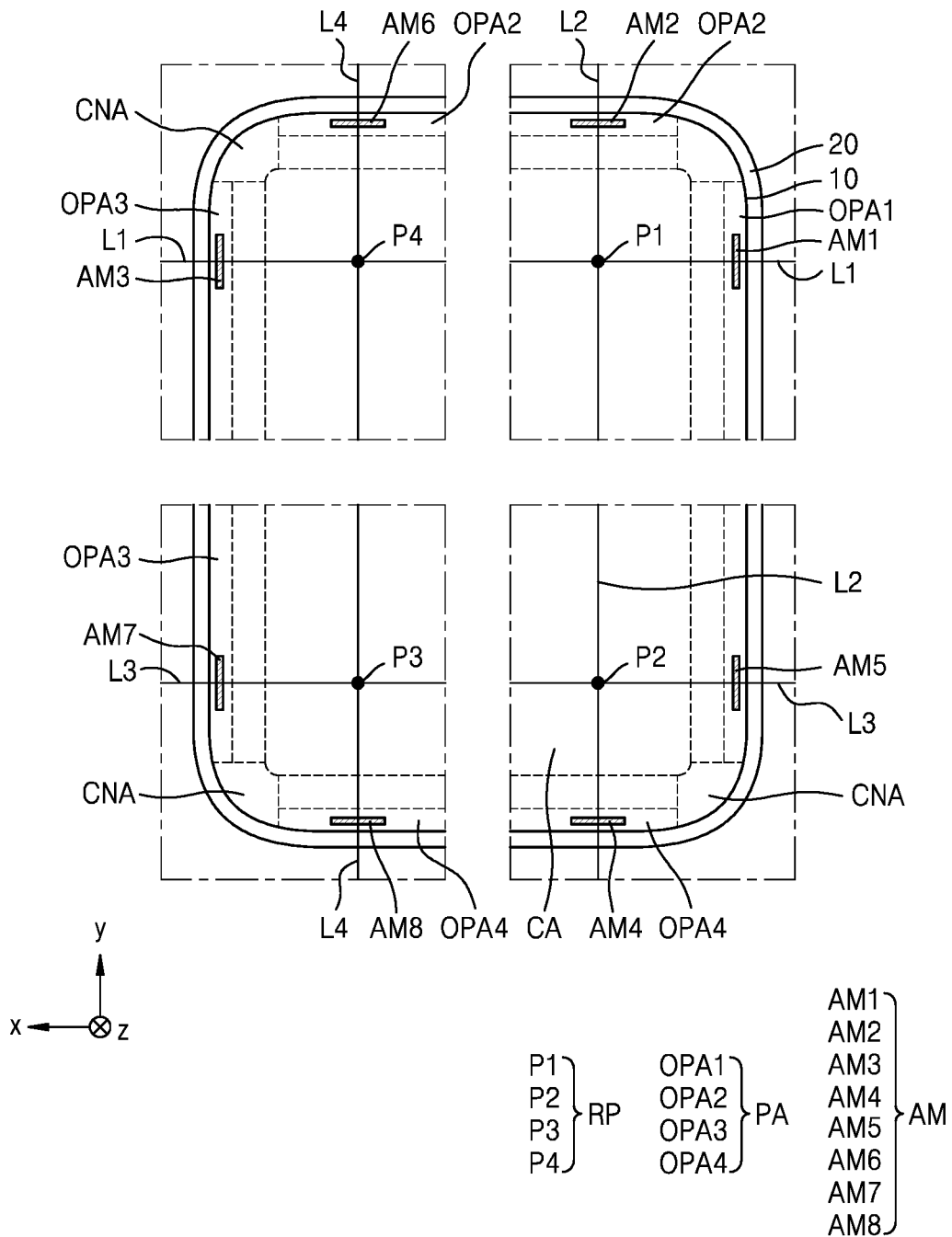
FIG. 9C is an enlarged view of a plurality of alignment marks in FIG. 9B.

FIGS. 9A and 9B are plan views schematically illustrating a method of manufacturing a display device, according to an embodiment. FIG. 9C is an enlarged view of a plurality of alignment marks AM in FIG. 9B. FIGS. 9A and 9B are rear views illustrating a bent display panel 10 and a bent cover window 20. In FIGS. 9A to 9C, the same reference numerals as those in FIG. 3 refer to the same members, and redundant descriptions thereof are omitted.

Referring to FIG. 9A, the display panel 10 may include a central area CA, a first adjacent area A1, a second adjacent area A2, a corner area CNA, and a peripheral area PA. The peripheral area PA may include a first outer peripheral area OPA1, a second outer peripheral area OPA2, a third outer peripheral area OPA3, and a fourth outer peripheral area OPA4. In an embodiment, the central area CA may be a flat area. The first adjacent area A1, the second adjacent area A2, the corner area CNA, and the peripheral area PA may be bent areas. In an embodiment, the first outer peripheral area OPA1, the second outer peripheral area OPA2, the third outer peripheral area OPA3, and the fourth outer peripheral area OPA4 may be bent. The first outer peripheral area OPA1, the second outer peripheral area OPA2, the third outer peripheral area OPA3, and the fourth outer peripheral area OPA4 may be bent areas.

The alignment mark AM may be provided in the display panel 10. A plurality of alignment marks AM may be in the peripheral area PA. The alignment marks AM may include a first alignment mark AM1, a second alignment mark AM2, a third alignment mark AM3, a fourth alignment mark AM4, a fifth alignment mark AM5, a sixth alignment mark AM6, a seventh alignment mark AM7, and an eighth alignment mark AM8.

A photographing member may be configured to photograph the alignment marks AM provided in the display panel 10. In an embodiment, the photographing member may be configured to photograph the first to eighth alignment mark AM1 to AM8 in a plan view. In other words, the photographing member may be configured to photograph the first to eighth alignment mark AM1 to AM8 in the z direction. For example, the photographing member may be configured to photograph the first alignment mark AM1, the second alignment mark AM2, the third alignment mark AM3, and the fourth alignment mark AM4 in a plan view. The photographing member may be configured to photograph the fifth alignment mark AM5, the sixth alignment mark AM6, the seventh alignment mark AM7, and the eighth alignment mark AM8 in a plan view. In the apparatus 1000 for manufacturing a display device, according to the embodiment, the control member 1200 sets the imaginary reference point by using data photographed by the photographing member 1100. Therefore, the photographing member 1100 configured to perform photographing at various angles may not be required. Accordingly, the apparatus 1000 for manufacturing a display device may be simplified.

The control member may be configured to identify the plurality of alignment marks AM provided in the display panel 10. In the present specification, the phrase "the control member identifies the plurality of alignment marks AM" means that the control member recognizes the plurality of alignment marks AM from the photographing data generated by the photographing member and sets the positions of the plurality of alignment marks AM. In an embodiment, the control member may be configured to identify the first alignment mark AM1, the second alignment mark AM2, the third alignment mark AM3, and the fourth alignment mark AM4. In an embodiment, the control member may be configured to identify all of the first to eighth alignment marks AM1 to AM8.

In an embodiment, the first alignment mark AM1 may have a rectangular shape having a first width w1 in the first direction (e.g., the x direction or the −x direction) and a second width w2 in the second direction (e.g., the y direction or the −y direction). In an embodiment, the second width w2 may be greater than the first width w1. Therefore, the first alignment mark AM1 may be clearly recognized by the photographing member.

Referring to FIGS. 9B and 9C, the control member may be configured to set the imaginary reference point RP, taking into account the alignment mark AM. The control member may form a first imaginary straight line L1 connecting the first alignment mark AM1 to the third alignment mark AM3. The control member may form a second imaginary straight line L2 connecting the second alignment mark AM2 to the fourth alignment mark AM4. The control member may form a third imaginary straight line L3 connecting the fifth alignment mark AM5 to the seventh alignment mark AM7. The control member may form a fourth imaginary straight line L4 connecting the sixth alignment mark AM6 to the eighth alignment mark AM8. At this time, each of the imaginary straight lines may pass through the center of the alignment mark AM.

The control member may be configured to set a first position P1 at which the first imaginary straight line L1 and the second imaginary straight line L2 cross each other. The control member may be configured to set a second position P2 at which the second imaginary straight line L2 and the third imaginary straight line L3 cross each other. The control member may be configured to set a third position P3 at which the third imaginary straight line L3 and the fourth imaginary straight line L4 cross each other. The control member may be configured to set a fourth position P4 at which the first imaginary straight line L1 and the fourth imaginary straight line L4 cross each other. The first position P1, the second position P2, the third position P3, and the fourth position P4 may be included in the imaginary reference point RP.

In the present embodiment, the control member may be configured to set the imaginary reference point RP from the positions of the plurality of alignment marks AM. Unlike the present embodiment, when the plurality of alignment marks AM are set as the reference point, an error may occur in the process of manufacturing the display device. For example, when the first outer peripheral area OPA1 and the third outer peripheral area OPA3 are bent with respect to an axis extending the second direction (e.g., the y direction or the −y direction), the positions of the first alignment mark AM1 and the third alignment mark AM3 in the first direction (e.g., the x direction or the −x direction) may be changed. Also, because the position of the alignment mark AM in the third direction (e.g., the z direction or the −z direction) is changed, the shape of the alignment mark AM may be enlarged or reduced. However, even when the first outer peripheral area OPA1 and the third outer peripheral area OPA3 are bent, the position of the first imaginary straight line L1 connecting the first alignment mark AM1 to the third alignment mark AM3 may not be changed.

Similarly, when the second outer peripheral area OPA2 and the fourth outer peripheral area OPA4 are bent with respect to an axis extending the first direction (e.g., the x direction or the −x direction), the positions of the second alignment mark AM2 and the fourth alignment mark AM4 in the second direction (e.g., the y direction or the −y direction) may be changed. However, even when the second outer peripheral area OPA2 and the fourth outer peripheral area OPA4 are bent, the position of the second imaginary straight line L2 connecting the second alignment mark AM2 to the fourth alignment mark AM4 may not be changed. Therefore, the positions of the first imaginary position P1 and the second imaginary position P2 may not be substantially affected by the bending of the peripheral area PA. As a simulation result, even when the process error occurs in the first direction (e.g., the x direction or the −x direction) and/or the second direction (e.g., the y direction or the −y direction) in the process of bending the display panel 10, the first imaginary position P1 and the second imaginary position P2 are not substantially changed in the display panel 10. Also, as a simulation result, even when the display panel 10 is bent in a state of being partially rotated or tilted in the third direction (e.g., the z direction or the −z direction), the first imaginary position P1 and the second imaginary position P2 are not substantially changed in the display panel 10. Therefore, when the first imaginary position P1 and the second imaginary position P2 are set, the process error may be reduced in the process of manufacturing the display device.

Figure 10A:
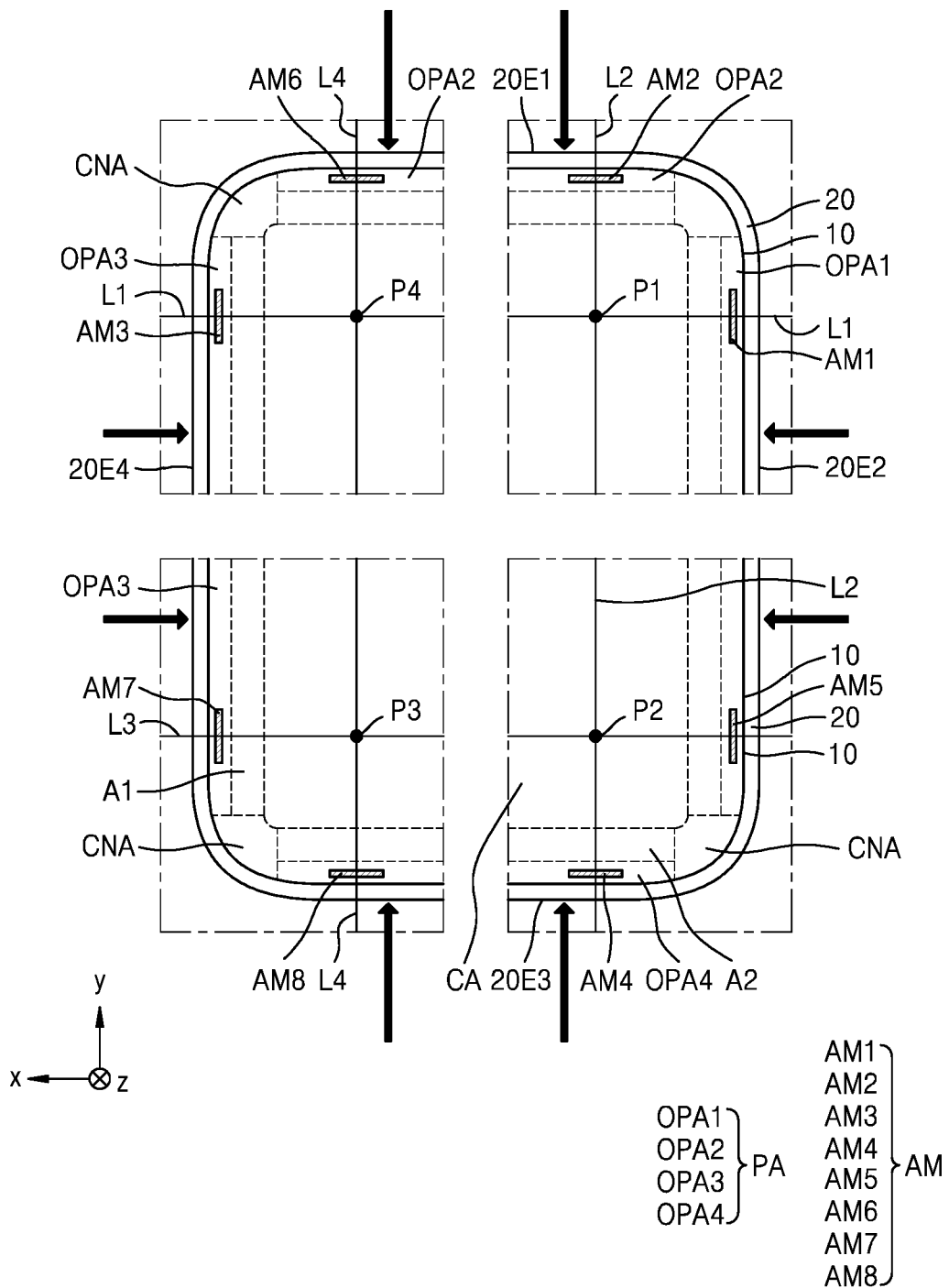
FIGS. 10A and 10B are plan views schematically illustrating a method of manufacturing a display device, according to another embodiment.
Figure 10B:
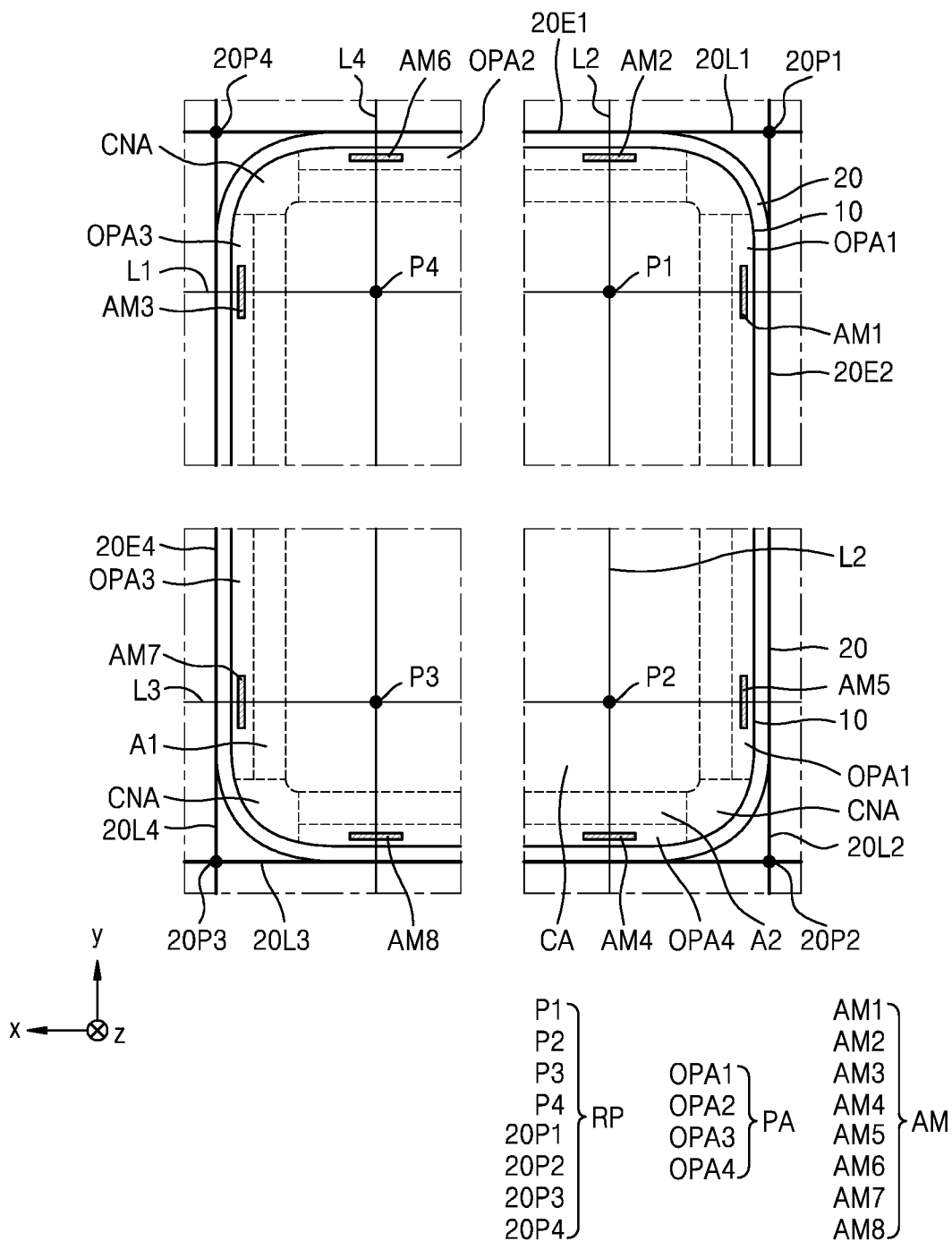

FIGS. 10A and 10B are plan views schematically illustrating a method of manufacturing a display device, according to another embodiment. FIGS. 10A and 10B are enlarged views of the plurality of alignment marks AM in the display panel 10 of FIG. 9B. FIGS. 10A and 10B are rear views schematically illustrating the display panel 10 and the cover window 20. In FIGS. 10A and 10B, the same reference numerals as those in FIG. 9C refer to the same members, and redundant descriptions thereof are omitted.

Referring to FIG. 10A, the display panel 10 may include a central area CA, a first adjacent area A1, a second adjacent area A2, a corner area CNA, and a peripheral area PA. The peripheral area PA may include a first outer peripheral area OPA1, a second outer peripheral area OPA2, a third outer peripheral area OPA3, and a fourth outer peripheral area OPA4. In an embodiment, the central area CA may be a flat area. The first adjacent area A1, the second adjacent area A2, the corner area CNA, and the peripheral area PA may be bent areas. In an embodiment, the first outer peripheral area OPA1, the second outer peripheral area OPA2, the third outer peripheral area OPA3, and the fourth outer peripheral area OPA4 may be bent. The first outer peripheral area OPA1, the second outer peripheral area OPA2, the third outer peripheral area OPA3, and the fourth outer peripheral area OPA4 may be bent areas.

The cover window 20 may be bonded to the display panel 10. The cover window 20 may include a first window edge 20E1 at least partially extending in the first direction (e.g., the x direction or the −x direction).

The cover window 20 may include a second window edge 20E2 at least partially extending in the second direction (e.g., the y direction or the −y direction). The cover window 20 may include a first window corner edge extending from the first window edge 20E1 to the second window edge 20E2.

The cover window 20 may include a third window edge 20E3 at least partially extending in the first direction (e.g., the x direction or the −x direction). The cover window 20 may include a second window corner edge extending from the second window edge 20E2 to the third window edge 20E3. The third window edge 20E3 may be spaced apart from the first window edge 20E1 with the display panel 10 therebetween.

The cover window 20 may include a fourth window edge 20E4 at least partially extending in the second direction (e.g., the y direction or the −y direction). The cover window 20 may include a third window corner edge extending from the third window edge 20E3 to the fourth window edge 20E4. The fourth window edge 20E4 may be spaced apart from the second window edge 20E2 with the display panel 10 therebetween. The cover window 20 may include a fourth window corner edge extending from the fourth window edge 20E4 to the first window edge 20E1.

The photographing member may be configured to photograph the edge of the cover window 20. The photographing member may be configured to photograph the first window edge 20E1. The photographing member may be configured to photograph the second window edge 20E2. The photographing member may be configured to photograph the third window edge 20E3. The photographing member may be configured to photograph the fourth window edge 20E4.

The photographing member may be configured to photograph the edge of the cover window 20 in a plan view. The photographing member may be configured to photograph the first to fourth window edges 20E1 to 20E4 in a plan view. In other words, the photographing member may be configured to photograph the first to fourth window edges 20E1 to 20E4 in the z direction.

The control member may be configured to identify the window edge. In the present specification, the phrase "the control member identifies the window edge" means that the control member recognizes the window edge from the photographing data generated by the photographing member and sets the position and the extending direction. The control member may be configured to identify the first window edge 20E1. The control member may be configured to identify the second window edge 20E2. The control member may be configured to identify the third window edge 20E3. The control member may be configured to identify the fourth window edge 20E4.

Referring to FIG. 10B, the control member may be configured to set the imaginary reference point RP, taking into account the edge of the cover window 20. The control member may form a first imaginary window straight line 20L1 overlapping the first window edge 20E1 and extending in the first direction (e.g., the x direction or the −x direction). The control member may form a second imaginary window straight line 20L2 overlapping the second window edge 20E2 and extending in the second direction (e.g., the y direction or the −y direction). The control member may form a third imaginary window straight line 20L3 overlapping the third window edge 20E3 and extending in the first direction (e.g., the x direction or the −x direction). The control member may form a fourth imaginary window straight line 20L4 overlapping the fourth window edge 20E4 and extending in the second direction (e.g., the y direction or the −y direction).

The control member may be configured to set a first window position 20P1 at which the first imaginary window straight line 20L1 and the second imaginary window straight line 20L2 cross each other. The control member may be configured to set a second window position 20P2 at which the second imaginary window straight line 20L2 and the third imaginary window straight line 20L3 cross each other. The control member may be configured to set a third window position 20P3 at which the third imaginary window straight line 20L3 and the fourth imaginary window straight line 20L4 cross each other. The control member may be configured to set a fourth window position 20P4 at which the fourth imaginary window straight line 20L4 and the first imaginary window straight line 20L1 cross each other. The first window position 20P1, the second window position 20P2, the third window position 20P3, and the fourth window position 20P4 may be included in the imaginary reference point RP.

In the present embodiment, the control member may be configured to set the imaginary reference point RP from the edge of the cover window 20 as well as the alignment mark AM. Therefore, the apparatus for manufacturing a display device may more precisely manufacture the display device by using various imaginary reference points RP, and may reduce the process error in the process of manufacturing the display device.

Figure 11A:
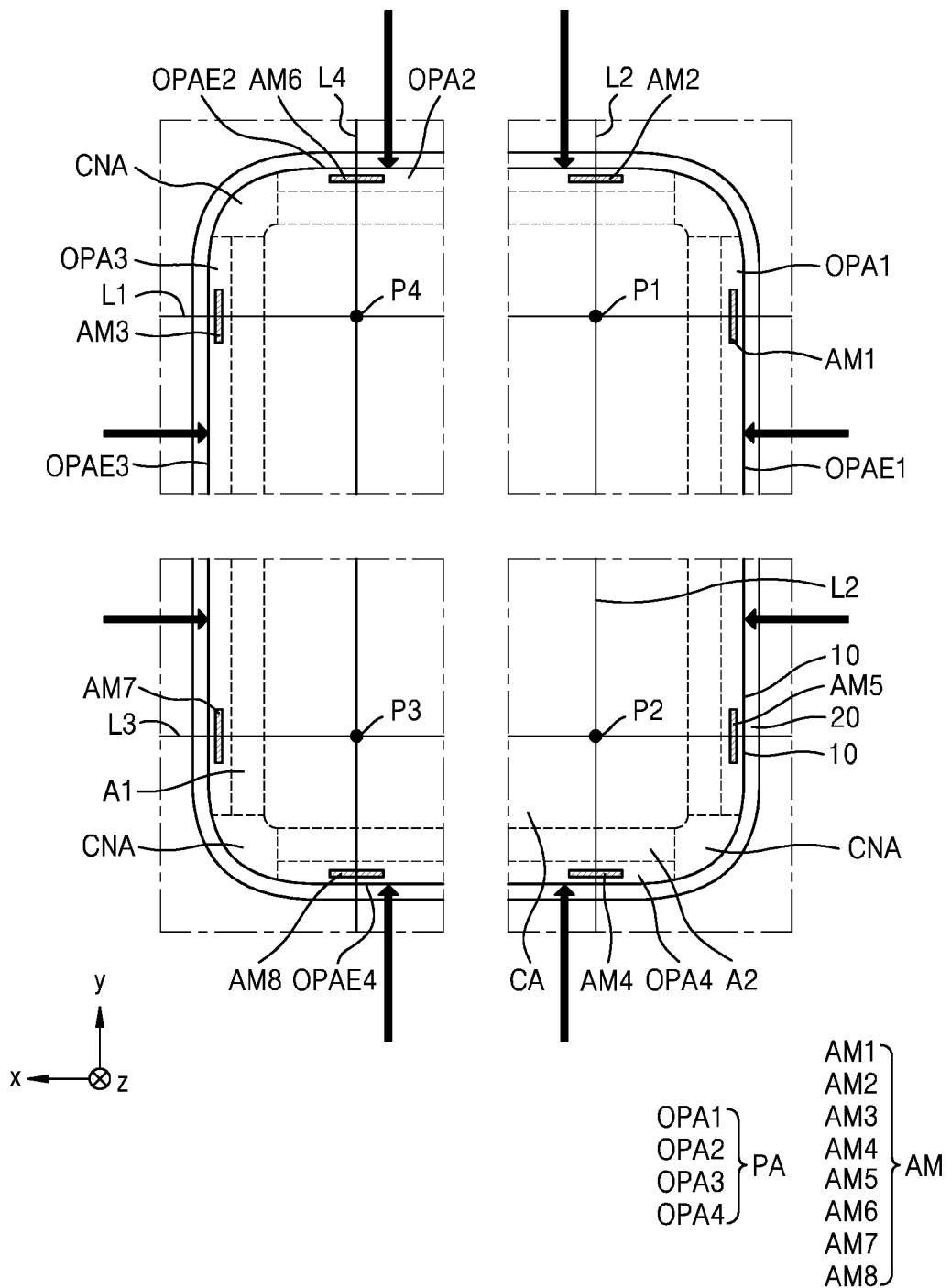
FIGS. 11A and 11B are plan views schematically illustrating a method of manufacturing a display device, according to another embodiment.
Figure 11B:
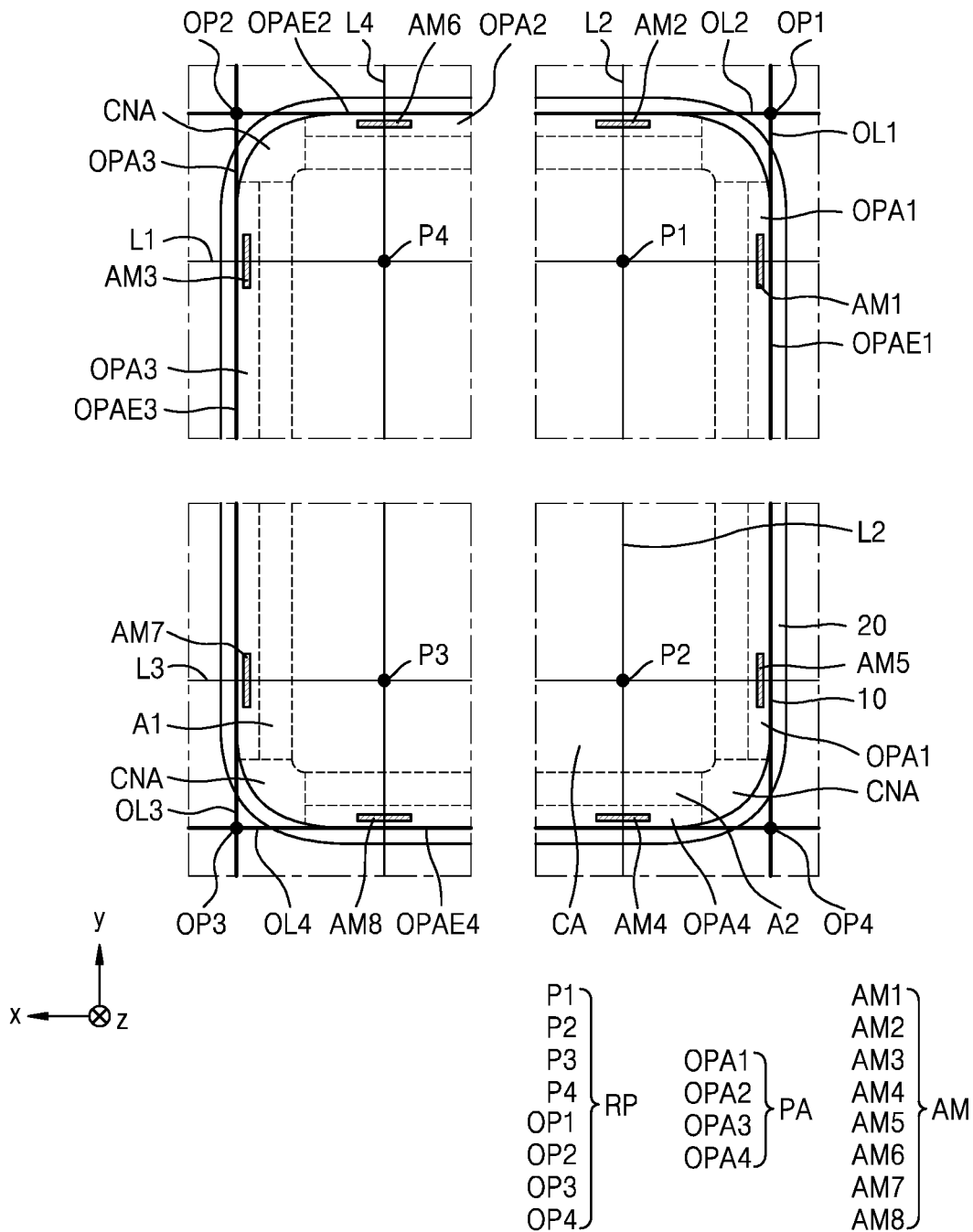

FIGS. 11A and 11B are plan views schematically illustrating a method of manufacturing a display device, according to another embodiment. FIGS. 11A and 11B are enlarged views of the plurality of alignment marks AM in the display panel 10 of FIG. 9B. FIGS. 11A and 11B are rear views schematically illustrating the display panel 10 and the cover window 20. In FIGS. 11A and 11B, the same reference numerals as those in FIG. 9C refer to the same members, and redundant descriptions thereof are omitted.

Referring to FIG. 11A, the display panel 10 may include a central area CA, a first adjacent area A1, a second adjacent area A2, a corner area CNA, and a peripheral area PA. The peripheral area PA may include a first outer peripheral area OPA1, a second outer peripheral area OPA2, a third outer peripheral area OPA3, and a fourth outer peripheral area OPA4. In an embodiment, the central area CA may be a flat area. The first adjacent area A1, the second adjacent area A2, the corner area CNA, and the peripheral area PA may be bent areas. In an embodiment, the first outer peripheral area OPA1, the second outer peripheral area OPA2, the third outer peripheral area OPA3, and the fourth outer peripheral area OPA4 may be bent. The first outer peripheral area OPA1, the second outer peripheral area OPA2, the third outer peripheral area OPA3, and the fourth outer peripheral area OPA4 may be bent areas.

The peripheral area PA may include an edge. The edge of the peripheral area PA may be the edge of the display panel 10. The first outer peripheral area OPA1 may have a first edge OPAE1. The second outer peripheral area OPA2 may have a second edge OPAE2. The third outer peripheral area OPA3 may have a third edge OPAE3. The fourth outer peripheral area OPA4 may have a fourth edge OPAE4.

In an embodiment, the first edge OPAE1 and the third edge OPAE3 may extend in the second direction (e.g., the y direction or the −y direction). The second edge OPAE2 and the fourth edge OPAE4 may extend in the first direction (e.g., the x direction or the −x direction).

The photographing member may be configured to photograph the edge of the peripheral area PA. The photographing member may be configured to photograph the first edge OPAE1. The photographing member may be configured to photograph the second edge OPAE2. The photographing member may be configured to photograph the third edge OPAE3. The photographing member may be configured to photograph the fourth edge OPAE4.

The photographing member may be configured to photograph the edge of the peripheral area PA in a plan view. The photographing member may be configured to photograph the first to fourth edges OPAE1 to OPAE4 in a plan view. In other words, the photographing member may be configured to photograph the first to fourth edges OPAE1 to OPAE4 in the z direction.

The control member may be configured to identify the edge of the peripheral area PA. In the present specification, the phrase "the control member identifies the edge of the peripheral area PA" means that the control member recognizes the edge of the peripheral area PA from the photographing data generated by the photographing member and sets the position and the extending direction. The control member may be configured to identify the first edge OPAE1. The control member may be configured to identify the second edge OPAE2. The control member may be configured to identify the third edge OPAE3. The control member may be configured to identify the fourth edge OPAE4.

Referring to FIG. 11B, the control member may be configured to set the imaginary reference point RP, taking into account the edge of the peripheral area PA. The control member may form a first imaginary outer straight line OL1 overlapping the first edge OPAE1 and extending in the second direction (e.g., the y direction or the −y direction). The control member may form a second imaginary outer straight line OL2 overlapping the second edge OPAE2 and extending in the first direction (e.g., the x direction or the −x direction). The control member may form a third imaginary outer straight line OL3 overlapping the third edge OPAE3 and extending in the second direction (e.g., the y direction or the −y direction). The control member may form a fourth imaginary outer straight line OL4 overlapping the fourth edge OPAE4 and extending in the first direction (e.g., the x direction or the −x direction).

The control member may be configured to set a first outer position OP1 at which the first imaginary outer straight line OL1 and the second imaginary outer straight line OL2 cross each other. The control member may be configured to set a second outer position OP2 at which the second imaginary outer straight line OL2 and the third imaginary outer straight line OL3 cross each other. The control member may be configured to set a third outer position OP3 at which the third imaginary outer straight line OL3 and the fourth imaginary outer straight line OL4 cross each other. The control member may be configured to set the first outer position OP1 at which the fourth imaginary outer straight line OL4 and the first imaginary outer straight line OL1 cross each other. The first outer position OP1, the second outer position OP2, the third outer position OP3, and the fourth outer position OP4 may be included in the imaginary reference point RP.

In the present embodiment, the control member may be configured to set the imaginary reference point RP from the edge of the display panel 10 as well as the alignment mark AM. Therefore, the apparatus for manufacturing a display device may more precisely manufacture the display device by using various imaginary reference points RP, and may reduce the process error in the process of manufacturing the display device.

Figure 12A:
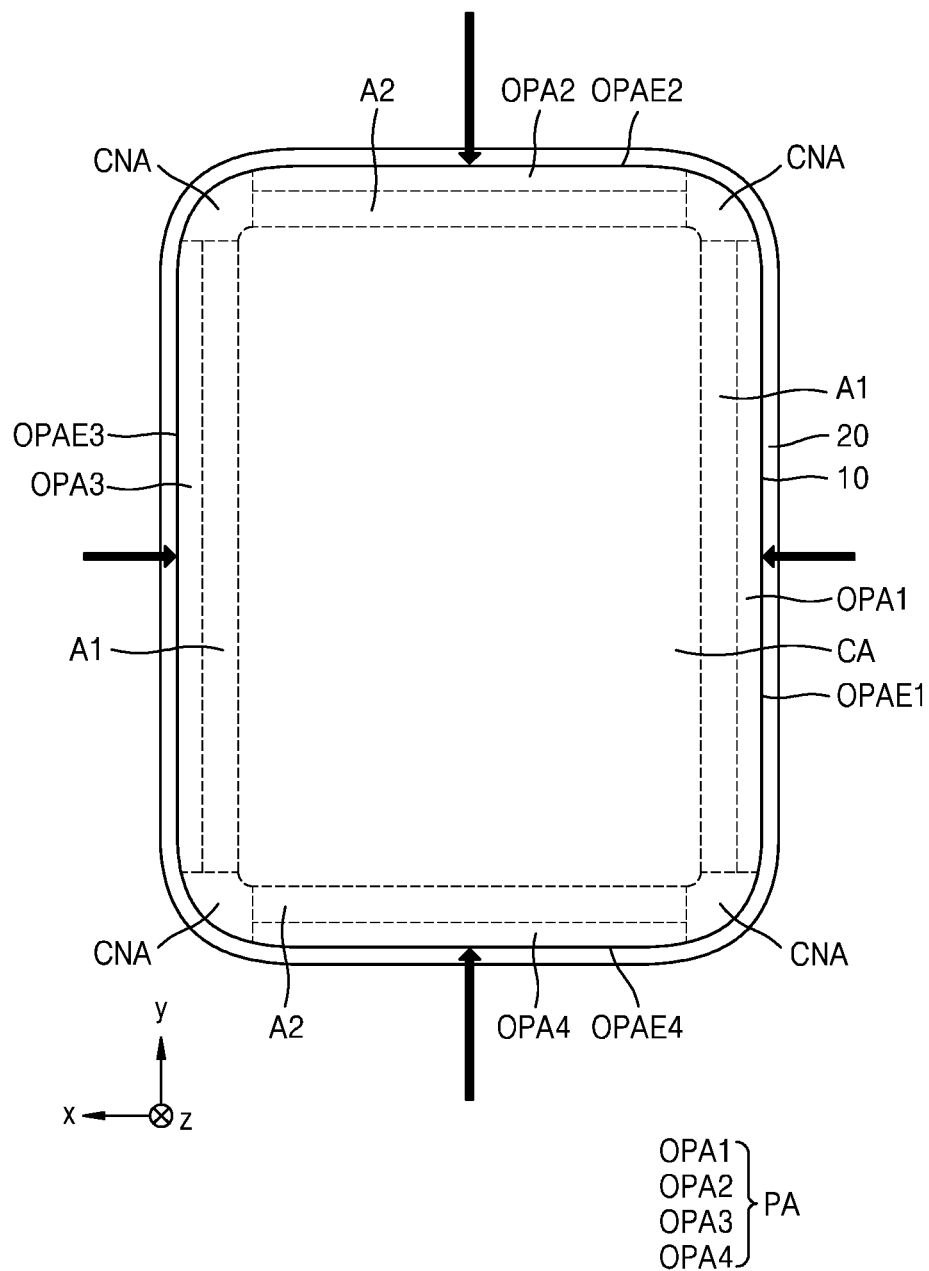
FIGS. 12A and 12B are plan views schematically illustrating a method of manufacturing a display device, according to another embodiment.
Figure 12B:
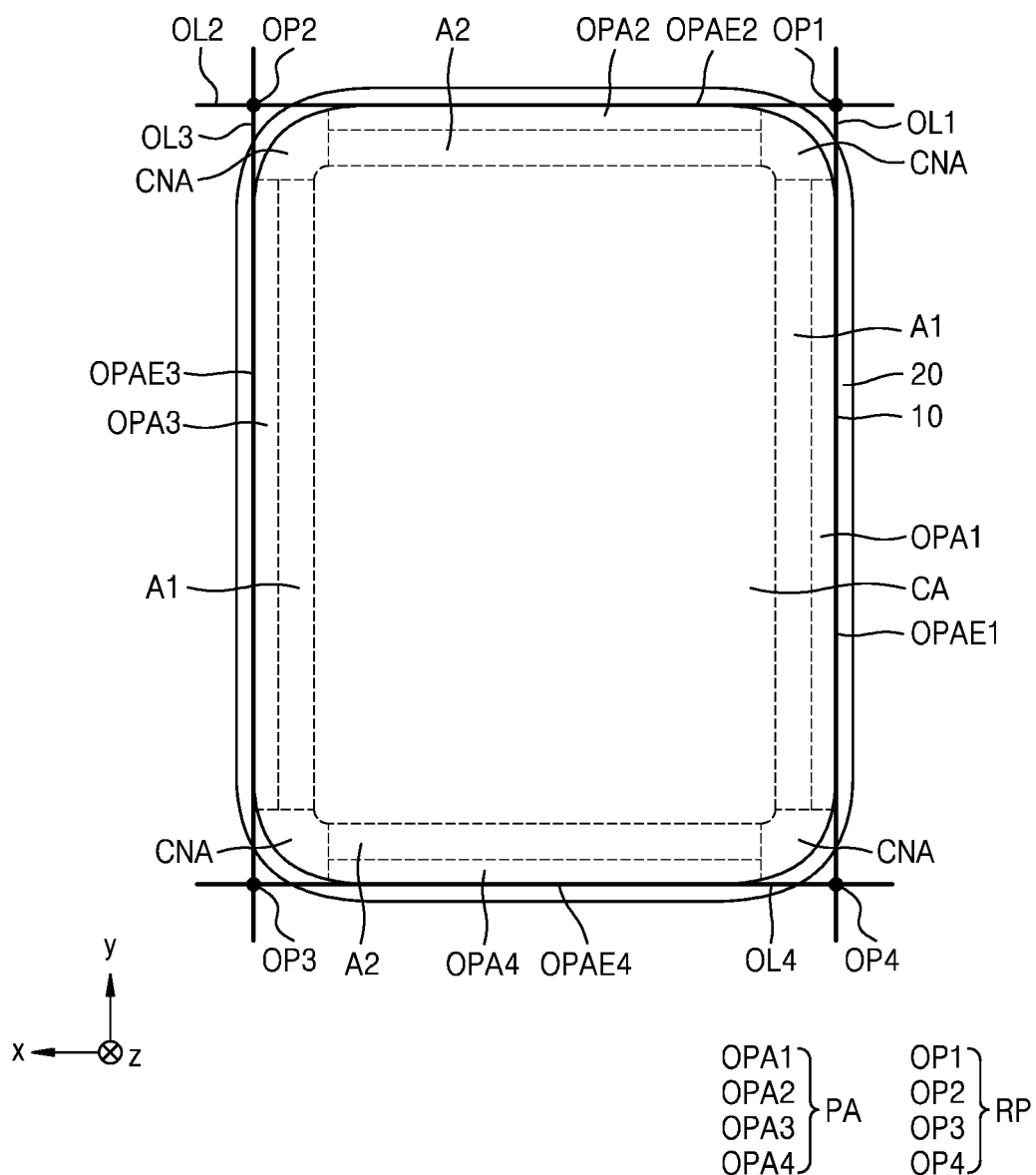

FIGS. 12A and 12B are plan views schematically illustrating a method of manufacturing a display device, according to another embodiment. FIGS. 12A and 12B are rear views schematically illustrating the display panel 10 and the cover window 20. In FIGS. 12A and 12B, the same reference numerals as those in FIG. 9A refer to the same members, and redundant descriptions thereof are omitted. The display panel 10 of FIG. 12A differs from the display panel 10 of FIG. 9A in that an alignment mark AM is not provided.

Referring to FIG. 12A, the display panel 10 may include a central area CA, a first adjacent area A1, a second adjacent area A2, a corner area CNA, and a peripheral area PA. The peripheral area PA may include a first outer peripheral area OPA1, a second outer peripheral area OPA2, a third outer peripheral area OPA3, and a fourth outer peripheral area OPA4. In an embodiment, the central area CA may be a flat area. The first adjacent area A1, the second adjacent area A2, the corner area CNA, and the peripheral area PA may be bent areas. In an embodiment, the first outer peripheral area OPA1, the second outer peripheral area OPA2, the third outer peripheral area OPA3, and the fourth outer peripheral area OPA4 may be bent. The first outer peripheral area OPA1, the second outer peripheral area OPA2, the third outer peripheral area OPA3, and the fourth outer peripheral area OPA4 may be bent areas.

The peripheral area PA may include an edge. The edge of the peripheral area PA may be the edge of the display panel 10. The first outer peripheral area OPA1 may have a first edge OPAE1. The second outer peripheral area OPA2 may have a second edge OPAE2. The third outer peripheral area OPA3 may have a third edge OPAE3. The fourth outer peripheral area OPA4 may have a fourth edge OPAE4.

In an embodiment, the first edge OPAE1 and the third edge OPAE3 may extend in the second direction (e.g., the y direction or the −y direction). The second edge OPAE2 and the fourth edge OPAE4 may extend in the first direction (e.g., the x direction or the −x direction).

The photographing member may be configured to photograph the edge of the peripheral area PA. The photographing member may be configured to photograph the first edge OPAE1. The photographing member may be configured to photograph the second edge OPAE2. The photographing member may be configured to photograph the third edge OPAE3. The photographing member may be configured to photograph the fourth edge OPAE4.

The photographing member may be configured to photograph the edge of the peripheral area PA in a plan view. The photographing member may be configured to photograph the first to fourth edges OPAE1 to OPAE4 in a plan view. In other words, the photographing member may be configured to photograph the first to fourth edges OPAE1 to OPAE4 in the z direction.

The control member may be configured to identify the edge of the peripheral area PA. The control member may be configured to identify the first edge OPAE1. The control member may be configured to identify the second edge OPAE2. The control member may be configured to identify the third edge OPAE3. The control member may be configured to identify the fourth edge OPAE4.

Referring to FIG. 12B, the control member may be configured to set an imaginary reference point RP, taking into account the first to fourth edges OPAE1 to OPAE4. The control member may form a first imaginary outer straight line OL1 overlapping the first edge OPAE1 and extending in the second direction (e.g., the y direction or the −y direction). The control member may form a second imaginary outer straight line OL2 overlapping the second edge OPAE2 and extending in the first direction (e.g., the x direction or the −x direction). The control member may form a third imaginary outer straight line OL3 overlapping the third edge OPAE3 and extending in the second direction (e.g., the y direction or the −y direction). The control member may form a fourth imaginary outer straight line OL4 overlapping the fourth edge OPAE4 and extending in the first direction (e.g., the x direction or the −x direction).

The control member may be configured to set a first outer position OP1 at which the first imaginary outer straight line OL1 and the second imaginary outer straight line OL2 cross each other. The control member may be configured to set a second outer position OP2 at which the second imaginary outer straight line OL2 and the third imaginary outer straight line OL3 cross each other. The control member may be configured to set a third outer position OP3 at which the third imaginary outer straight line OL3 and the fourth imaginary outer straight line OL4 cross each other. The control member may be configured to set the first outer position OP1 at which the fourth imaginary outer straight line OL4 and the first imaginary outer straight line OL1 cross each other. The first outer position OP1, the second outer position OP2, the third outer position OP3, and the fourth outer position OP4 may be included in the imaginary reference point RP.

In the present embodiment, the control member may be configured to set the imaginary reference point RP from the edge of the display panel 10. Therefore, the apparatus for manufacturing a display device may precisely manufacture the display device, and may reduce the process error in the process of manufacturing the display device.

Also, in some embodiments, the imaginary reference point RP may be set from the edge of the cover window 20 similarly to FIGS. 10A and 10B without providing the alignment mark AM on the display panel 10.

Figure 13:
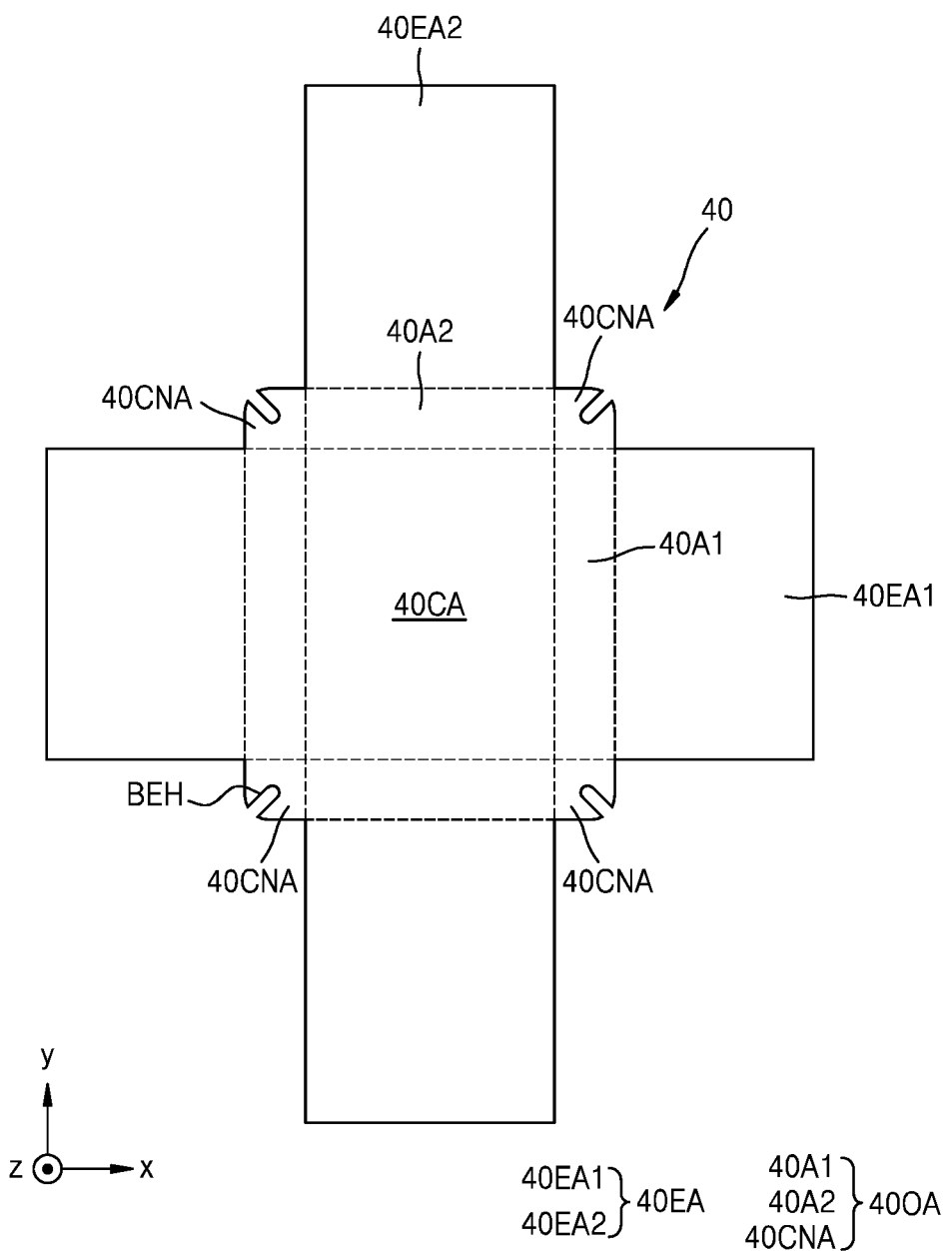
FIG. 13 is a plan view illustrating a guide film according to an embodiment.

FIG. 13 is a plan view illustrating a guide film 40 according to an embodiment.

Referring to FIG. 13, the guide film 40 may be prepared. The guide film 40 may include a guide central area 40CA, a guide outer area 400A, and a guide extension area 40EA. The guide outer area 400A may be outside the guide central area 40CA. The guide outer area 400A may include a first guide adjacent area 40A1, a second guide adjacent area 40A2, and a guide corner area 40CNA.

The first guide adjacent area 40A1 may be adjacent to the guide central area 40CA in the first direction (e.g., the x direction or the −x direction). The second guide adjacent area 40A2 may be adjacent to the guide central area 40CA in the second direction (e.g., the y direction or the −y direction). The guide corner area 40CNA may be between the first guide adjacent area 40A1 and the second guide adjacent area 40A2. In an embodiment, a plurality of guide corner areas 40CNA may be provided. In an embodiment, the guide corner area 40CNA may include a cutout groove BEH.

The guide extension area 40EA may extend outward from the guide outer area 400A. In an embodiment, the guide extension area 40EA may include a first guide extension area 40EA1 and a second guide extension area 40EA2. The first guide extension area 40EA1 may extend from the first guide adjacent area 40A1 in the first direction (e.g., the x direction or the −x direction). The second guide extension area 40EA2 may extend from the second guide adjacent area 40A2 in the second direction (e.g., the y direction or the −y direction).

Although FIG. 13 illustrates that the guide film 40 includes four guide extension areas 40EA, the inventive concepts are not limited thereto. Fewer or more guide extension areas 40EA may be provided according to the shape of the display panel. Also, although FIG. 13 illustrates that the guide extension area 40EA has a rectangular shape in a plan view, the guide extension area 40EA may have various shapes, for example, a polygonal shape such as a triangular shape, a partially circular shape, and a partially elliptical shape.

Figure 14A:
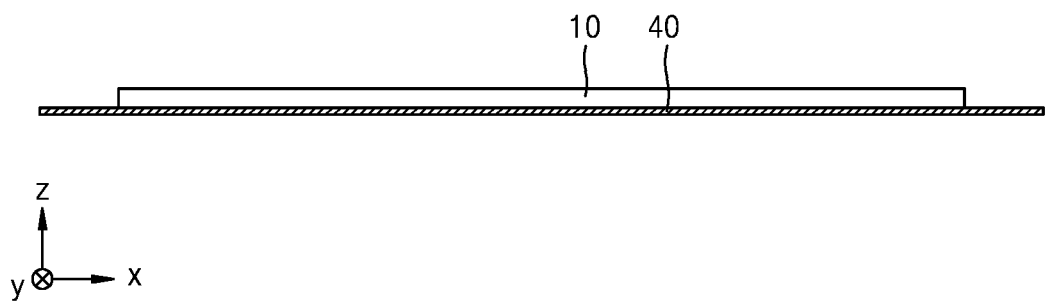
FIGS. 14A, 14B, 14C, 14D, 14E, 14F, 14G, 14H, 14I, 14J, 14K, 14L, 14M, and 14N are diagrams schematically illustrating a method of manufacturing a display device, according to an embodiment.
Figure 14B:
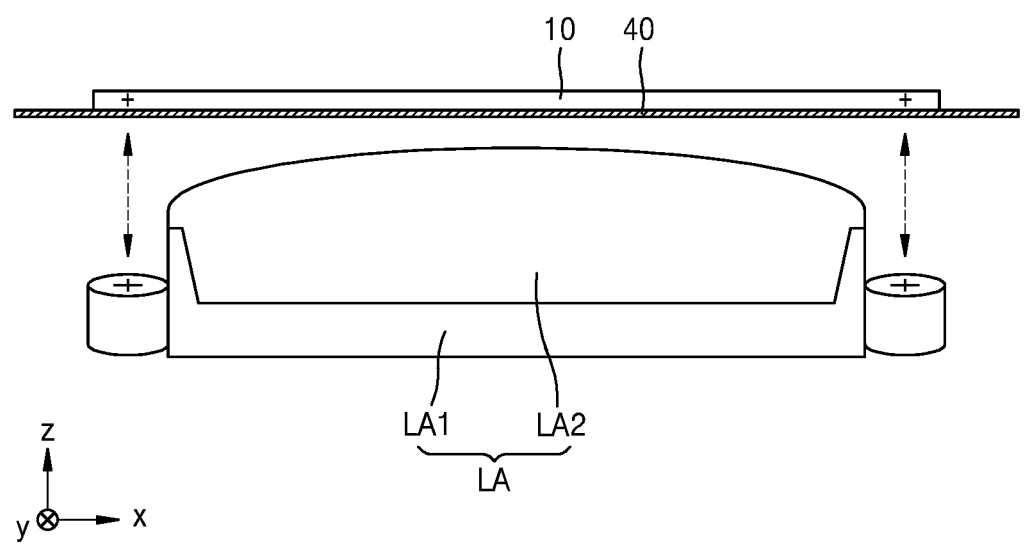
Figure 14C:
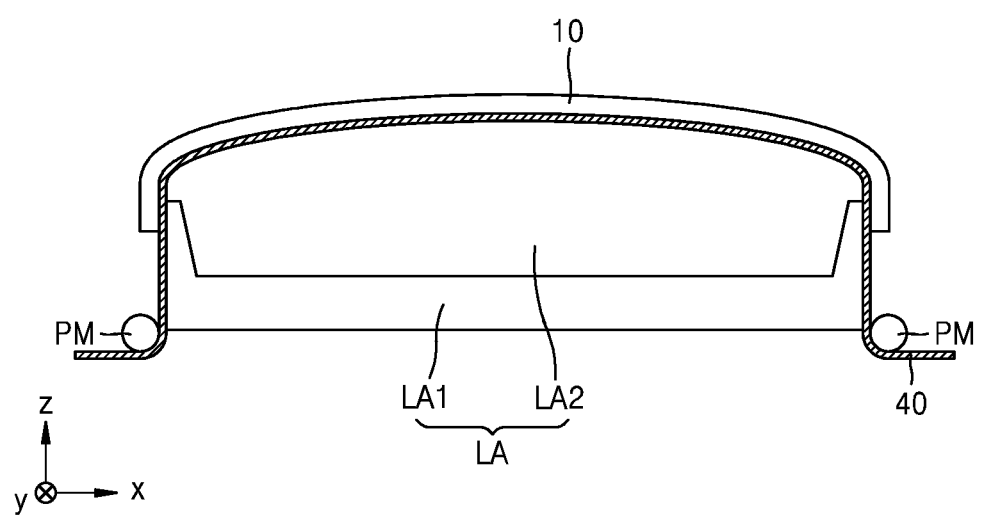
Figure 14D:
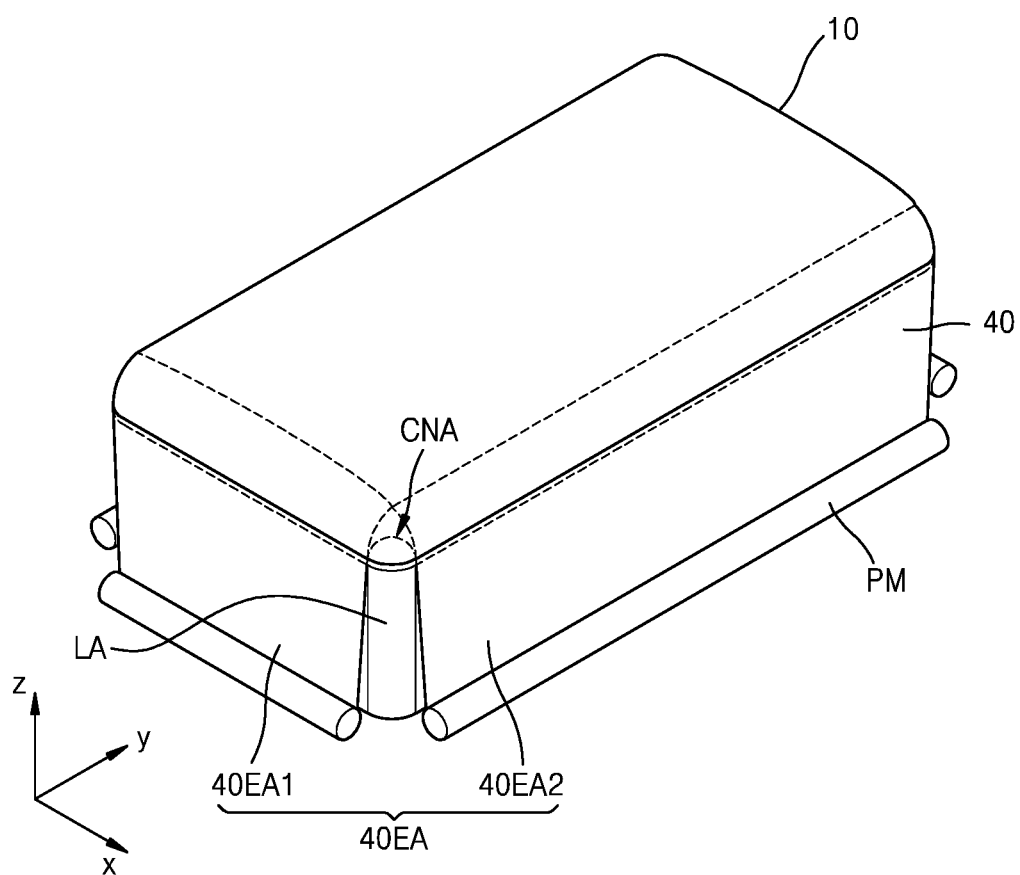
Figure 14E:
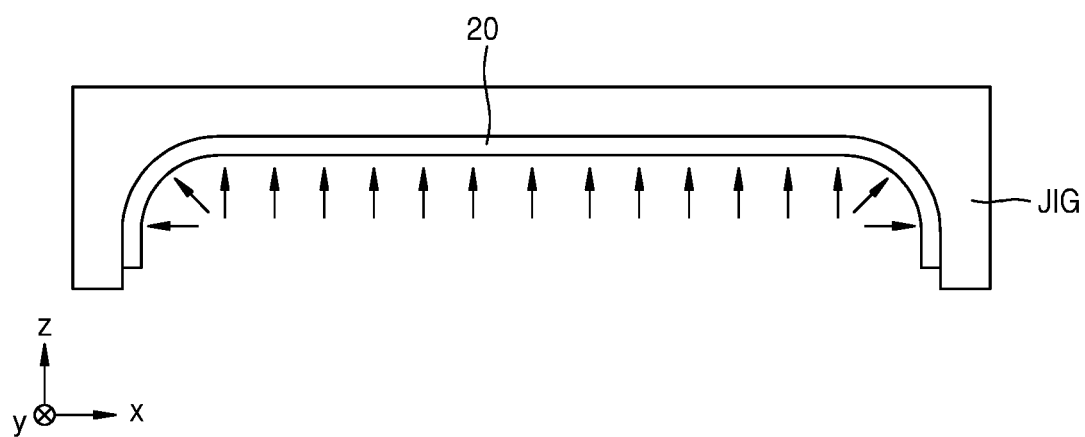
Figure 14F:
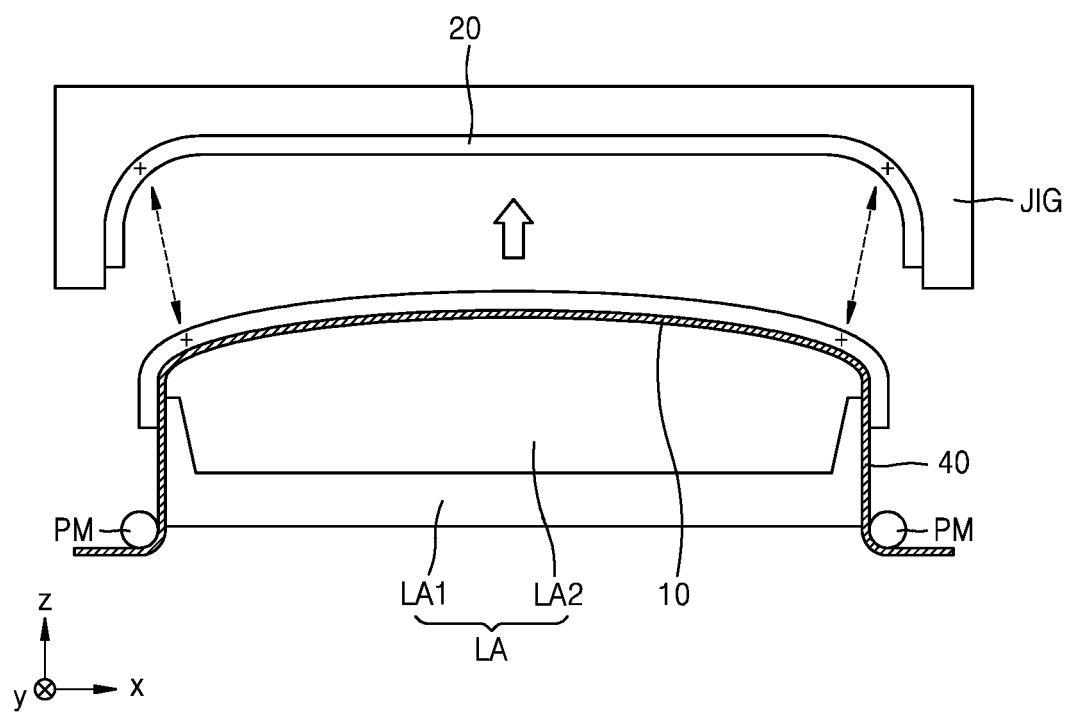
Figure 14G:
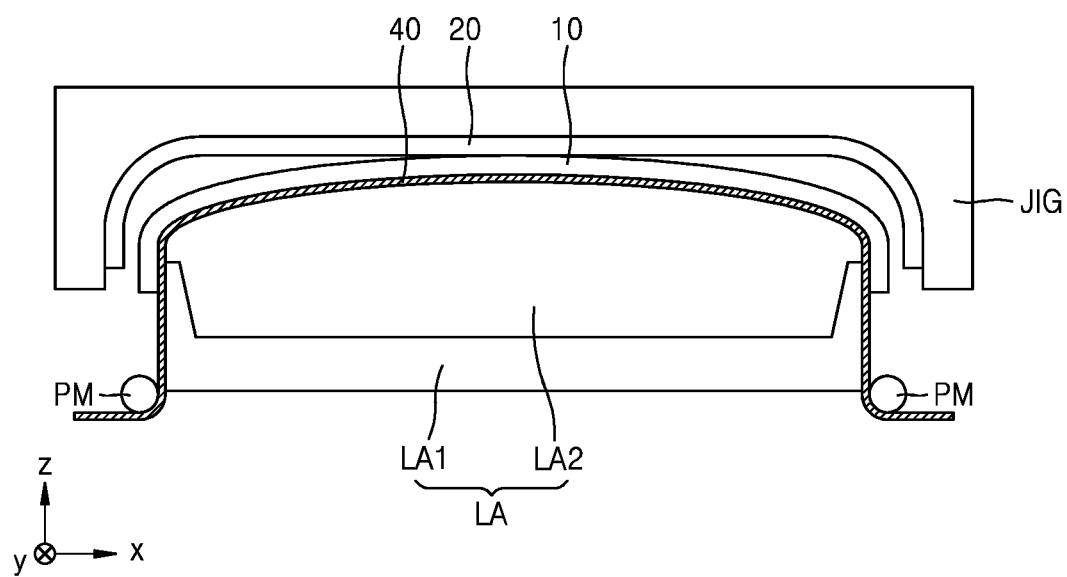
Figure 14H:
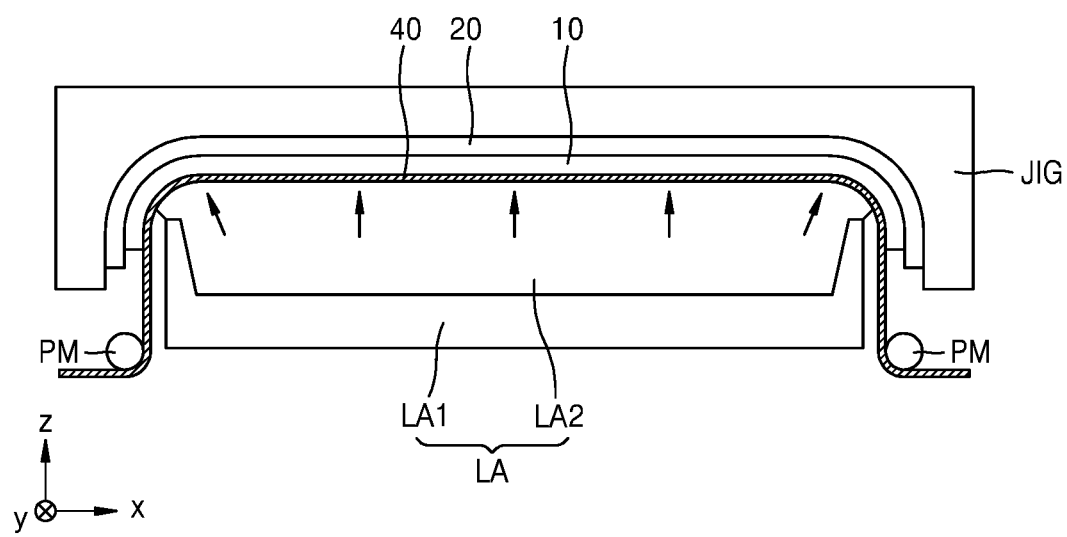
Figure 14I:
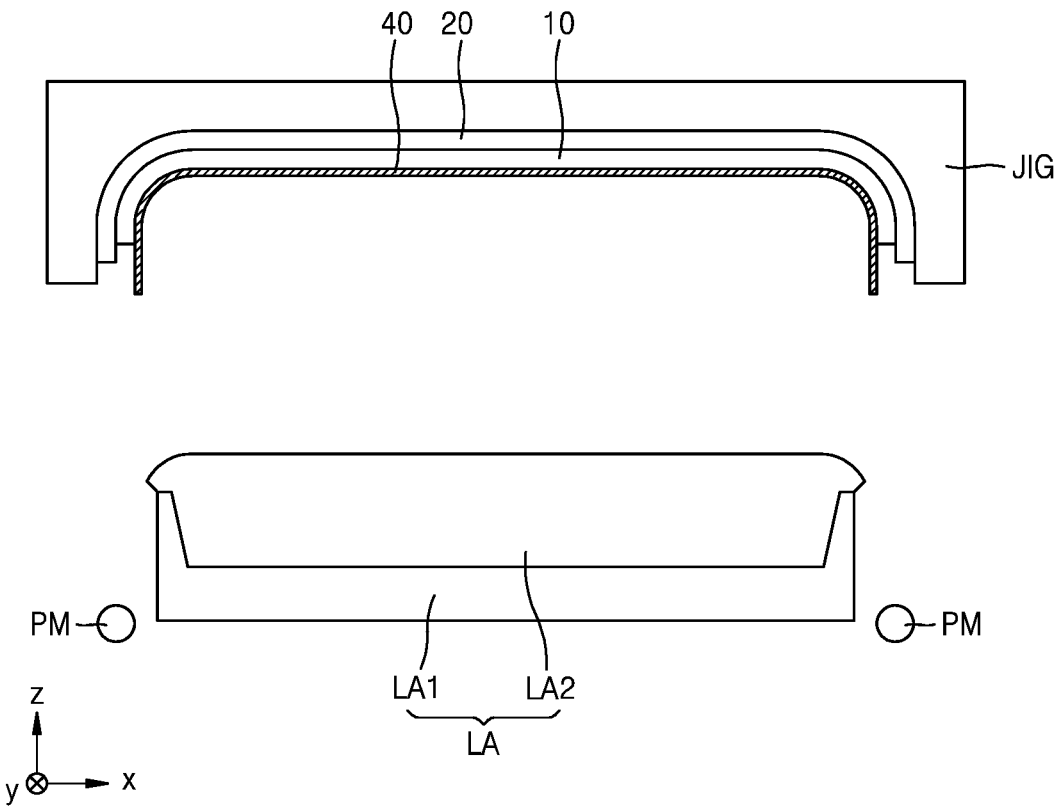
Figure 14J:
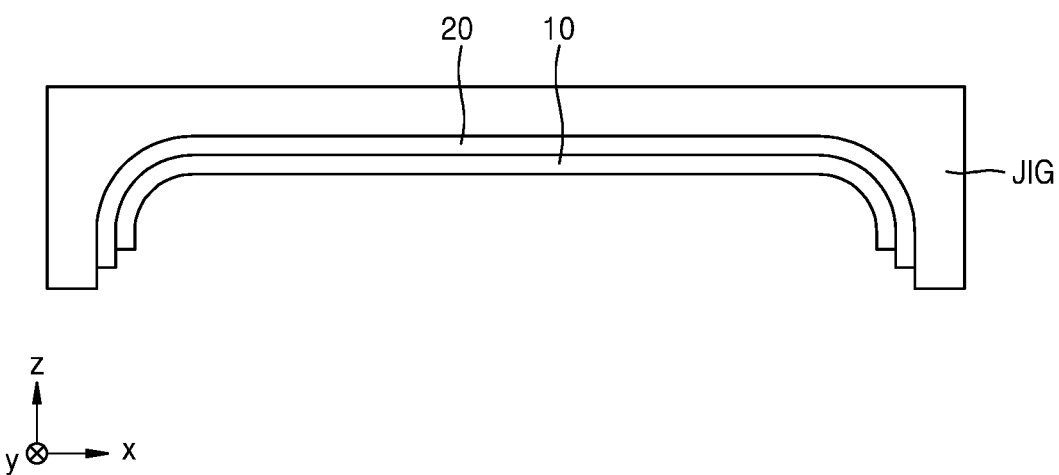
Figure 14K:
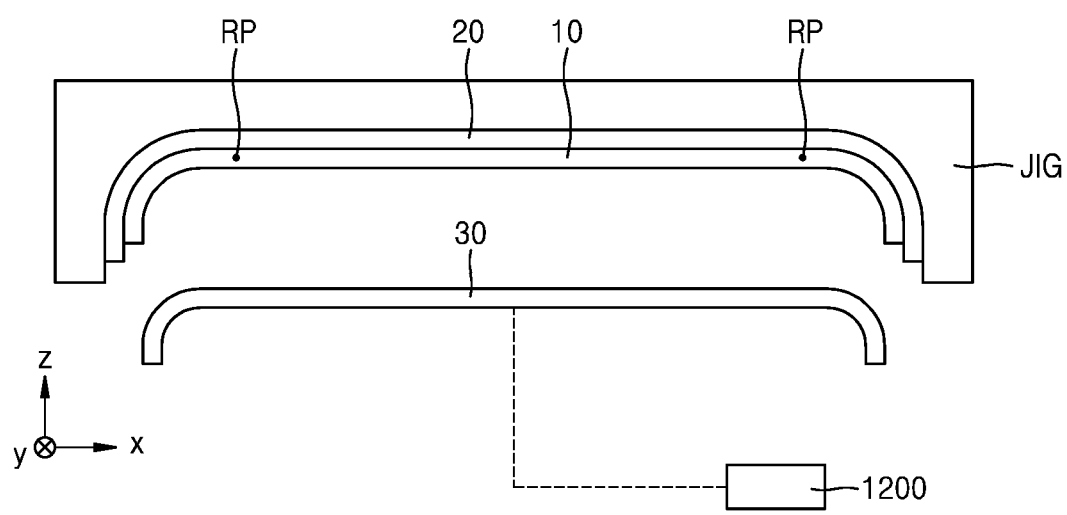
Figure 14L:
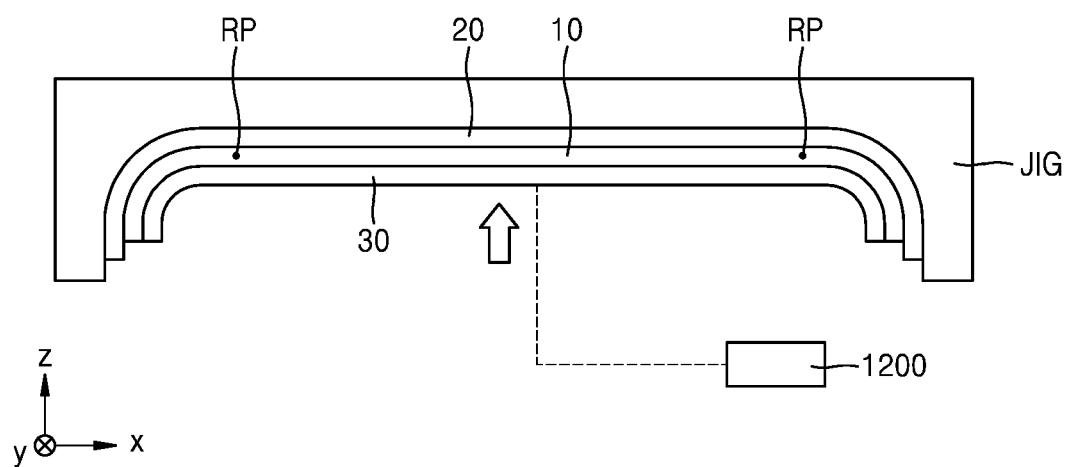
Figure 14M:
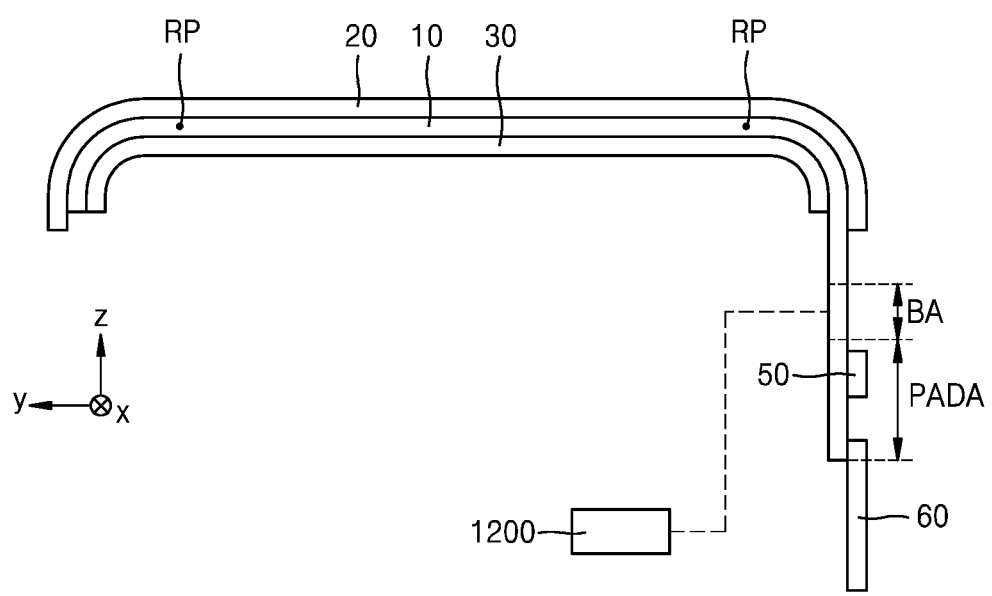
Figure 14N:
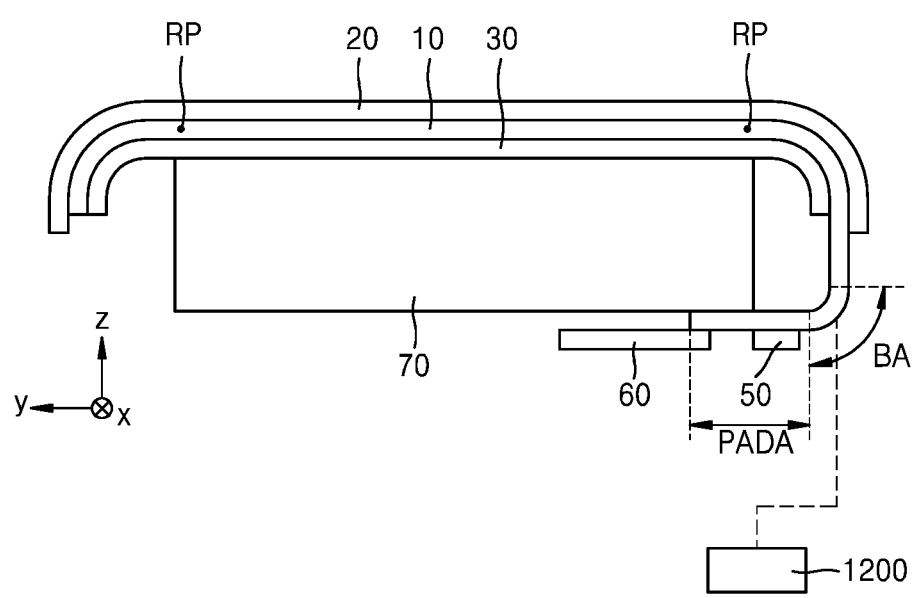

FIGS. 14A to 14N are diagrams schematically illustrating a method of manufacturing a display device, according to an embodiment.

Referring to FIG. 14A, a display panel 10 may be on a guide film 40. In some embodiments, a functional layer, including an adhesive layer, may be further above and/or below the display panel 10. In an embodiment, when the guide film 40 is on the display panel 10, the display panel 10 may be arranged to correspond to a guide central area (see 40CA of FIG. 13) and a guide outer area (see 400A of FIG. 13) of the guide film 40. In an embodiment, a central area (see CA of FIG. 3) of the display panel 10 may overlap the guide central area (see 40CA of FIG. 13) of the guide film 40, and the outer area (see OA of FIG. 3) of the display panel 10 may overlap the guide outer area (see 400A of FIG. 13). A guide extension area (see 40EA of FIG. 13) may not overlap the display panel 10.

Referring to FIG. 14B, a lamination apparatus LA including a support part LA1 and a volume change part LA2 on the support part LA1 may be prepared. The support part LA1 may support the volume change part LA2. The volume change part LA2 may include an air pump, or may be connected to the air pump. Because the volume change part LA2 has a low modulus, the shape and volume of the volume change part LA2 may vary according to air pressure through the air pump. Alternatively, the volume change part LA2 may include a diaphragm.

The display panel 10 and the lamination apparatus LA may be arranged so that the rear surface of the display panel 10 faces the lamination apparatus LA. In other words, the guide film 40 may be placed on the lamination apparatus LA side. The guide film 40 may be between the display panel 10 and the lamination apparatus LA.

The display panel 10 and the lamination apparatus LA may be aligned. For example, the display panel 10 and the lamination apparatus LA may be aligned so that a first alignment key on the display panel 10 and a second alignment key on the lamination apparatus LA match each other.

Referring to FIGS. 14C and 14D, the display panel 10 may be pre-formed through the guide film 40. In an embodiment, the shape of the display panel 10 may be deformed by applying an external force (e.g., a tensile force) to the guide film 40.

Specifically, the guide film 40 may be seated on the lamination apparatus LA. A push member PM may be positioned on the guide film 40. The guide film 40 may come into close contact with the side surface of the lamination apparatus LA by using the push member PM. For example, as the push members PM press a first guide extension area 40EA1 and a second guide extension area 40EA2 of the guide film 40, a tensile force may be applied to the guide film 40, and the guide film 40 may be deformed along the outer surface of the lamination apparatus LA. Also, the display panel 10 on the guide film 40 may be bent.

Referring to FIG. 14E, a cover window 20 may be prepared. In an embodiment, a jig (JIG) including a concave surface corresponding to the final shape of the cover window 20 may deforms the cover window 20 to have a flat surface and a curved surface. In other words, the JIG may be a frame having the shape of the display device to be finally manufactured. The cover window 20 comes into close contact with the concave surface of the JIG, so that the cover window 20 is deformed in the shape of the concave surface of the JIG.

Referring to FIG. 14F, after the display panel 10 is preformed, the display panel 10 may be arranged on the front surface of the display panel 10 to face the cover window 20. In other words, the cover window 20 may be arranged on the display panel 10. The display panel 10 and the cover window 20 may be aligned. In an embodiment, the display panel 10 and the cover window 20 may be aligned so that a first alignment key in the display panel 10 and a third alignment key in the cover window match each other.

The display panel 10 may be bonded to the cover window 20.

Referring to FIGS. 14G and 14H, the cover window 20 may be bonded to the front surface of the display panel 10. For example, as illustrated in FIG. 14G, a portion of the display panel 10 may be bonded to the cover window 20 first. In an embodiment, the flat surface (e.g., the central area) having no curvature in the final shape of the display panel 10 may be bonded to the cover window 20 first.

After that, as illustrated in FIG. 14H, as the shape of the volume change part LA2 of the lamination apparatus LA changes and the volume thereof increases, the remaining portions of the display panel 10, for example, the outer area, may be bonded to the cover window 20.

In an embodiment, the processes of bonding a first adjacent area, a second adjacent area, and a corner area of the display panel 10 to the cover window 20 may be simultaneously performed. For example, when the first adjacent area and the second adjacent area are bonded to the cover window 20, the corner area may naturally come into contact with and be bonded to the cover window 20 by a peripheral external force. In another embodiment, at least one of the first adjacent area, the second adjacent area, and the corner area of the display panel 10 may be bonded to the cover window 20, and at least another of the first adjacent area, the second adjacent area, and the corner area of the display panel 10 may be bonded to the cover window 20.

Referring to FIG. 14I, after the bonding of the display panel 10 to the cover window 20 is performed, the lamination apparatus LA may be removed from the display panel 10 to which the cover window 20 is bonded.

Referring to FIG. 14J, the guide film 40 may be removed. In an embodiment, the guide film 40 may be removed by ultraviolet irradiation. In some embodiments, the process of removing the guide film 40 may be omitted.

The display panel 10 and the cover window 20 may be cured. In an embodiment, the display panel 10 and the cover window 20 are irradiated with ultraviolet rays. When the display panel 10 and the cover window 20 are irradiated with ultraviolet rays, air bubbles may escape from the adhesive member bonded to the display panel 10.

Referring to FIGS. 14K and 14L, the cover panel 30 may be arranged on the display panel 10. In an embodiment, the cover panel 30 may be bonded to the lower surface of the display panel 10. The display panel 10 and the cover panel 30 may be aligned. In this case, the control member 1200 may take into account the imaginary reference point RP. The imaginary reference point RP may function as coordinates indicating the position of the display panel 10, and the cover panel 30 may be aligned to a preset position based on the coordinates. Therefore, the display panel 10 and the cover panel 30 may be accurately aligned even when there occurs an error in which the position of the alignment mark is changed differently from the preset position in the process of bending the display panel 10 of FIGS. 14A to 14J.

After that, the cover panel 30 may be bonded to the display panel 10. The cover panel 30 may be accurately bonded to the display panel 10, taking into account the imaginary reference point RP. Therefore, the process error may be reduced.

Referring to FIGS. 14M and 14N, the display panel 10 may include a bending area BA and a pad area PADA. A driving chip 50 and a PCB 60 may be bonded in the pad area PADA. In an embodiment, the driving chip 50 and the PCB 60 may be electrically connected to the display panel 10 before the process of bonding the display panel 10 and the cover window 20 of FIGS. 14A to 14J.

A spacer 70 may be arranged below the cover panel 30. First, the display panel 10 and the spacer 70 may be aligned. In this case, the control member 1200 may take into account the imaginary reference point RP. The imaginary reference point RP may function as coordinates indicating the position of the display panel 10, and the spacer 70 may be aligned at a preset position based on the coordinates and may be bonded to an accurate position.

After that, the bending area BA may be bent. In this case, the control member 1200 may take into account the imaginary reference point RP. In other words, the bending area BA may be bent, taking into account the imaginary reference point RP. The imaginary reference point RP may function as coordinates indicating the position of the display panel 10, and the bending area BA may be bent from the imaginary reference point RP in a preset shape. Therefore, the pad area PADA may face the lower surface of the display panel 10, and a non-display area in which pixels are not arranged may be reduced.

Even when there occurs an error in which the position of the alignment mark is changed differently from the preset position in the process of bending the display panel 10 of FIGS. 14A to 14J, the bending area BA may be bent with a preset bending curvature from the imaginary reference point RP that is not changed. Therefore, because the bending area BA has an unset bending curvature, the damage to the display device may be prevented or reduced during the manufacturing process.

As described above, according to one or more embodiments, the first position which is included in the imaginary reference point and at which the first imaginary straight line connecting the first alignment mark to the third alignment mark and the second imaginary straight line connecting the second alignment mark to the fourth alignment mark cross each other may be set. Thus, even when the alignment marks are located in the bent area, the imaginary reference point that is not substantially changed may be set from the alignment marks. Therefore, in the process of manufacturing the display device, the process error may be reduced.

Also, according to one or more embodiments, the imaginary reference point may be set from the edge of at least one of the display panel and the cover window. Therefore, even when the display panel has a bent shape, the process error may be reduced in the process of manufacturing the display device.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An apparatus for manufacturing a display device, the apparatus comprising:
   a photographing member configured to photograph a first alignment mark, a second alignment mark, a third alignment mark, and a fourth alignment mark, which are provided in a display panel; and
   a control member configured to set an imaginary reference point, taking into account the first alignment mark, the second alignment mark, the third alignment mark, and the fourth alignment mark, which are photographed by the photographing member,
   wherein the control member is further configured to set a first position which is included in the imaginary reference point and at which a first imaginary straight line connecting the first alignment mark to the third alignment mark and a second imaginary straight line connecting the second alignment mark to the fourth alignment mark cross each other
   wherein the display panel includes a central area, a first outer peripheral area outside the central area and including the first alignment mark, a second outer peripheral area outside the central area and including the second alignment mark, a third outer peripheral area spaced apart from the first outer peripheral area in a first direction with the central area therebetween and including the third alignment mark, and a fourth outer peripheral area spaced apart from the second outer peripheral area in a second direction crossing the first direction with the central area therebetween and including the fourth alignment mark, wherein the first outer peripheral area, the second outer peripheral area, the third outer peripheral area, and the fourth outer peripheral area are bent, and wherein the photographing member is further configured to photograph the first alignment mark, the second alignment mark, the third alignment mark, and the fourth alignment mark in a plan view.

2. The apparatus of claim 1, wherein:
the first outer peripheral area further includes a fifth alignment mark spaced apart from the first alignment mark in the second direction;
the second outer peripheral area further includes a sixth alignment mark spaced apart from the second alignment mark in the first direction;
the third outer peripheral area further includes a seventh alignment mark spaced apart from the third alignment mark in the second direction;
the fourth outer peripheral area further includes an eighth alignment mark spaced apart from the fourth alignment mark in the first direction; and
the photographing member is further configured to photograph the fifth alignment mark, the sixth alignment mark, the seventh alignment mark, and the eighth alignment mark in a plan view.

3. The apparatus of claim 1, wherein the control member is further configured to:
set a second position which is included in the imaginary reference point and at which the second imaginary straight line and a third imaginary straight line connecting the fifth alignment mark to the seventh alignment mark cross each other;
set a third position which is included in the imaginary reference point and at which the third imaginary straight line and a fourth imaginary straight line connecting the sixth alignment mark to the eighth alignment mark cross each other; and
set a fourth position which is included the imaginary reference point and at which the first imaginary straight line and the fourth imaginary straight line cross each other.

4. The apparatus of claim 1, wherein:
the photographing member is further configured to photograph a first edge of the first outer peripheral area and a second edge of the second outer peripheral area; and
the control member is further configured to set a first outer position which is included in the imaginary reference point and at which a first imaginary outer straight line overlapping the first edge and extending in the second direction and a second imaginary outer straight line overlapping the second edge and extending in the first direction cross each other.

5. An apparatus for manufacturing a display device, the apparatus comprising:
a photographing member configured to photograph a first alignment mark, a second alignment mark, a third alignment mark, and a fourth alignment mark, which are provided in a display panel; and
a control member configured to set an imaginary reference point, taking into account the first alignment mark, the second alignment mark, the third alignment mark, and the fourth alignment mark, which are photographed by the photographing member, wherein the control member is further configured to set a first position which is included in the imaginary reference point and at which a first imaginary straight line connecting the first alignment mark to the third alignment mark and a second imaginary straight line connecting the second alignment mark to the fourth alignment mark cross each other, wherein, in a cover window bonded to the display panel, the photographing member is further configured to photograph a first window edge of the cover window at least partially extending in a first direction, and a second window edge of the cover window at least partially extending in a second direction crossing the first direction, and wherein the control member is further configured to set a first window position which is included in the imaginary reference point and at which a first imaginary window straight line overlapping the first window edge and extending in the first direction and a second imaginary window straight line overlapping the second window edge and extending in the second direction cross each other.

6. An apparatus for manufacturing a display device, the apparatus comprising:
a photographing member configured to photograph a first alignment mark, a second alignment mark, a third alignment mark, and a fourth alignment mark, which are provided in a display panel; and
a control member configured to set an imaginary reference point, taking into account the first alignment mark, the second alignment mark, the third alignment mark, and the fourth alignment mark, which are photographed by the photographing member, wherein the control member is further configured to set a first position which is included in the imaginary reference point and at which a first imaginary straight line connecting the first alignment mark to the third alignment mark and a second imaginary straight line connecting the second alignment mark to the fourth alignment mark cross each other, and wherein the apparatus further comprises at least one of a backlight member and an optical member between the photographing member and the display panel.

7. An apparatus for manufacturing a display device, the apparatus comprising:
a photographing member configured to photograph a first alignment mark, a second alignment mark, a third alignment mark, and a fourth alignment mark, which are provided in a display panel; and
a control member configured to set an imaginary reference point, taking into account the first alignment mark, the second alignment mark, the third alignment mark, and the fourth alignment mark, which are photographed by the photographing member, wherein the control member is further configured to set a first position which is included in the imaginary reference point and at which a first imaginary straight line connecting the first alignment mark to the third alignment mark and a second imaginary straight line connecting the second alignment mark to the fourth alignment mark cross each other, and wherein the control member is further configured to take into account the imaginary reference point when a cover panel is arranged on the display panel.

8. An apparatus for manufacturing a display device, the apparatus comprising:

a photographing member configured to photograph a first alignment mark, a second alignment mark, a third alignment mark, and a fourth alignment mark, which are provided in a display panel; and a control member configured to set an imaginary reference point, taking into account the first alignment mark, the second alignment mark, the third alignment mark, and the fourth alignment mark, which are photographed by the photographing member, wherein the control member is further configured to set a first position which is included in the imaginary reference point and at which a first imaginary straight line connecting the first alignment mark to the third alignment mark and a second imaginary straight line connecting the second alignment mark to the fourth alignment mark cross each other, wherein the display panel includes a bending area and a pad area outside the bending area, and wherein the control member is further configured to take into account the imaginary reference point when bending the bending area.

9. An apparatus for manufacturing a display device, the apparatus comprising:

a photographing member configured to photograph a first edge of a first outer peripheral area and a second edge of a second outer peripheral area in a display panel including a central area, the first outer peripheral area adjacent in a first direction and arranged outside the central area, and the second outer peripheral area adjacent in a second direction crossing the first direction and arranged outside the central area; and a control member configured to set an imaginary reference point, taking into account the first edge and the second edge, wherein the control member is further configured to set a first outer position which is included in the imaginary reference point and at which a first imaginary outer straight line overlapping the first edge and extending in the second direction and a second imaginary outer straight line overlapping the second edge and extending in the first direction cross each other.

10. A method of manufacturing a display device, the method comprising:

photographing a first alignment mark, a second alignment mark, a third alignment mark, and a fourth alignment mark, which are provided in a display panel; and setting a first position which is included in an imaginary reference point and at which a first imaginary straight line connecting the first alignment mark to the third alignment mark and a second imaginary straight line connecting the second alignment mark to the fourth alignment mark cross each other, wherein the display panel includes a central area, a first outer peripheral area outside the central area and including the first alignment mark, a second outer peripheral area outside the central area and including the second alignment mark, a third outer peripheral area spaced apart from the first outer peripheral area in a first direction with the central area therebetween and including the third alignment mark, and a fourth outer peripheral area spaced apart from the second outer peripheral area in a second direction crossing the first direction with the central area therebetween and including the fourth alignment mark, and wherein the first outer peripheral area, the second outer peripheral area, the third outer peripheral area, and the fourth outer peripheral area are bent.

11. The method of claim 10, wherein:

the first outer peripheral area further includes a fifth alignment mark spaced apart from the first alignment mark in the second direction;

the second outer peripheral area further includes a sixth alignment mark spaced apart from the second alignment mark in the first direction;

the third outer peripheral area further includes a seventh alignment mark spaced apart from the third alignment mark in the second direction;

the fourth outer peripheral area further includes an eighth alignment mark spaced apart from the fourth alignment mark in the first direction; and the method further comprises:

setting a second position which is included in the imaginary reference point and at which the second imaginary straight line and a third imaginary straight line connecting the fifth alignment mark to the seventh alignment mark cross each other;

setting a third position which is included in the imaginary reference point and at which the third imaginary straight line and a fourth imaginary straight line connecting the sixth alignment mark to the eighth alignment mark cross each other; and setting a fourth position which is included in the imaginary reference point and at which the first imaginary straight line and the fourth imaginary straight line cross each other.

12. The method of claim 10, wherein:

the display panel further includes a corner area that is arranged at a corner and bent; and a plurality of pixels are in the central area and the corner area.

13. The method of claim 10, further comprising:

photographing a first edge of the first outer peripheral area and a second edge of the second outer peripheral area; and setting a first outer position which is included in the imaginary reference point and at which a first imaginary outer straight line overlapping the first edge and extending in the second direction and a second imaginary outer straight line overlapping the second edge and extending in the first direction cross each other.

14. The method of claim 10, wherein a photographing member is configured to photograph the first alignment mark, the second alignment mark, the third alignment mark, and the fourth alignment mark in a plan view.

15. A method of manufacturing a display device, the method comprising:

photographing a first alignment mark, a second alignment mark, a third alignment mark, and a fourth alignment mark, which are provided in a display panel; and setting a first position which is included in an imaginary reference point and at which a first imaginary straight line connecting the first alignment mark to the third alignment mark and a second imaginary straight line connecting the second alignment mark to the fourth alignment mark cross each other, wherein, in a cover window bonded to the display panel, photographing a first window edge of the cover window at least partially extending in a first direction, and a second window edge of the cover window at least partially extending in a second direction crossing the first direction, and wherein setting a first window position which is included in the imaginary reference point and at which a first imaginary window straight line overlapping the first window edge and extending in the first direction and a second imaginary window straight line overlapping the second window edge and extending in the second direction cross each other.

16. A method of manufacturing a display device, the method comprising:
   photographing a first alignment mark, a second alignment mark, a third alignment mark, and a fourth alignment mark, which are provided in a display panel;
   setting a first position which is included in an imaginary reference point and at which a first imaginary straight line connecting the first alignment mark to the third alignment mark and a second imaginary straight line connecting the second alignment mark to the fourth alignment mark cross each other; and
   arranging a cover panel on the display panel, taking into account the imaginary reference point.

17. A method of manufacturing a display device, the method comprising:
   photographing a first alignment mark, a second alignment mark, a third alignment mark, and a fourth alignment mark, which are provided in a display panel; and
   setting a first position which is included in an imaginary reference point and at which a first imaginary straight line connecting the first alignment mark to the third alignment mark and a second imaginary straight line connecting the second alignment mark to the fourth alignment mark cross each other;
   the display panel includes a bending area and a pad area outside the bending area, and
   the method further comprises bending the bending area, taking into account the imaginary reference point.

18. A method of manufacturing a display device, the method comprising:
   photographing a first edge of a first outer peripheral area and a second edge of a second outer peripheral area in a display panel including a central area, the first outer peripheral area adjacent in a first direction and arranged outside the central area, and the second outer peripheral area adjacent in a second direction crossing the first direction and arranged outside the central area; and
   setting a first outer position which is included in an imaginary reference point and at which a first imaginary outer straight line overlapping the first edge and extending in the second direction and a second imaginary outer straight line overlapping the second edge and extending in the first direction cross each other.

* * * * *